(12) United States Patent
Yokogawa

(10) Patent No.: US 10,403,665 B2
(45) Date of Patent: *Sep. 3, 2019

(54) TWO-DIMENSIONAL SOLID-STATE IMAGE CAPTURE DEVICE WITH POLARIZATION MEMBER, COLOR FILTER AND LIGHT SHIELDING LAYER FOR SUB-PIXEL REGIONS AND POLARIZATION-LIGHT DATA PROCESSING METHOD TO OBTAIN POLARIZATION DIRECTION AND POLARIZATION COMPONENT INTENSITY

(71) Applicant: SONY SEMICONDUCTOR SOLUTIONS CORPORATION, Kanagawa (JP)

(72) Inventor: Sozo Yokogawa, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/491,226

(22) Filed: Apr. 19, 2017

(65) Prior Publication Data

US 2017/0221949 A1    Aug. 3, 2017

Related U.S. Application Data

(60) Continuation of application No. 15/063,200, filed on Mar. 7, 2016, now Pat. No. 9,659,986, which is a (Continued)

(30) Foreign Application Priority Data

May 11, 2009 (JP) .................................. 2009-114809

(51) Int. Cl.
    *H04N 9/04*     (2006.01)
    *H04N 5/335*    (2011.01)
    *H01L 27/146*   (2006.01)

(52) U.S. Cl.
    CPC .. *H01L 27/14625* (2013.01); *H01L 27/14621* (2013.01); *H01L 27/14623* (2013.01);
    (Continued)

(58) Field of Classification Search
    CPC ......... H01L 27/14625; H01L 27/14623; H01L 27/14621; H01L 27/14685; H04N 5/238;
    (Continued)

(56) References Cited

U.S. PATENT DOCUMENTS 7,760,256 B2    7/2010   Kanamori et al.
8,045,163 B2 *  10/2011  Grau ..................... G01J 4/04
                                                    356/364
(Continued)

*Primary Examiner* — Que Tan Le
*Assistant Examiner* — Jennifer D Bennett
(74) *Attorney, Agent, or Firm* — Chip Law Group

(57) ABSTRACT

A two-dimensional solid-state image capture device includes pixel areas arranged in a two-dimensional matrix, each pixel area being constituted by multiple sub-pixel regions, each sub-pixel region having a photoelectric conversion element. A polarization member is disposed at a light incident side of at least one of the sub-pixel regions constituting each pixel area. The polarization member has strip-shaped conductive light-shielding material layers and slit areas, provided between the strip-shaped conductive light-shielding material layers. Each sub-pixel region further has a wiring layer for controlling an operation of the photoelectric conversion element, and the polarization member and the wiring layer are made of the same material and are disposed on the same virtual plane.

9 Claims, 13 Drawing Sheets

Related U.S. Application Data continuation of application No. 14/280,406, filed on May 16, 2014, now Pat. No. 9,313,424, which is a division of application No. 12/763,299, filed on Apr. 20, 2010, now Pat. No. 8,759,742.

(52) U.S. Cl.
CPC ....... *H01L 27/14685* (2013.01); *H04N 5/335* (2013.01); *H04N 9/045* (2013.01); *H04N 2209/046* (2013.01)

(58) Field of Classification Search
CPC ........ H04N 5/335; H04N 9/045; H04N 5/235; H04N 2209/046
See application file for complete search history.

(56) References Cited

U.S. PATENT DOCUMENTS

| | | | |
|---|---|---|---|
| 8,759,742 B2* | 6/2014 | Yokogawa | ........ H01L 27/14621 250/208.1 |
| 9,659,986 B2* | 5/2017 | Yokogawa | ........ H01L 27/14621 |
| 2006/0274171 A1* | 12/2006 | Wang | ....................... G06K 7/14 348/294 |
| 2008/0170143 A1* | 7/2008 | Yoshida | ............ H01L 27/14621 348/294 |
| 2009/0278954 A1 | 11/2009 | Kanamori et al. | |

* cited by examiner

FIG. 10

TWO-DIMENSIONAL SOLID-STATE IMAGE CAPTURE DEVICE WITH POLARIZATION MEMBER, COLOR FILTER AND LIGHT SHIELDING LAYER FOR SUB-PIXEL REGIONS AND POLARIZATION-LIGHT DATA PROCESSING METHOD TO OBTAIN POLARIZATION DIRECTION AND POLARIZATION COMPONENT INTENSITY

CROSS REFERENCE TO RELATED APPLICATIONS

The present application is a continuation application of U.S. patent application Ser. No. 15/063,200, filed Mar. 7, 2016, which is a continuation application of U.S. patent application Ser. No. 14/280,406, filed May 16, 2014, now U.S. Pat. No. 9,313,424, which is a divisional application of U.S. patent application Ser. No. 12/763,299, filed Apr. 20, 2010, now U.S. Pat. No. 8,759,742, which claims priority from prior Japanese Priority Patent Application JP 2009-114809 filed in the Japan Patent Office on May 11, 2009, the entire contents of which are hereby incorporated by reference.

BACKGROUND OF THE INVENTION

1. Field of the Invention

The present invention relates to a two-dimensional solid-state image capture device and a polarization-light data processing method therefor.

2. Description of the Related Art

Two-dimensional solid-state image capture devices that obtain images through photography of subjects by using photoelectric conversion elements including two-dimensional solid-state image capture elements are increasingly used. Examples include a digital still camera, a video camera, and a camcorder (which is an integration of a photographing unit (such as a video camera) and a recording unit, and which is an abbreviation of a camera and recorder). CCD (charge coupled device) image capture elements and CMOS (complementary metal oxide semiconductor) image capture elements, which are solid-state image capture elements mainly used today, have sensitivities in a wide range from a visible-light wavelength to a near-infrared-light wavelength and can render vivid color images. The photoelectric conversion elements, however, have no intrinsic sensitivity to polarization. That is, the situation of the currently available two-dimensional solid-state image capture devices is that polarization information provided by light is unutilized and eliminated.

Although the sunlight is unpolarized, light resulting from reflection and dispersion of the sunlight contains polarization components that depend on the surface state of a reflection surface. For example, the sky during the daytime, snowy scenery, or the like contains a large amount of polarization component polarized in a particular direction. In addition, during photography across an "interface", for example, during photography in which glass of a show window or the like is interposed or during photography at the surface of water, the surface of a lake, or the like, separation of polarization components and non-polarization components makes it possible to improve the image contrast and also makes it possible to eliminate unwanted information. For example, a polarization element can be advantageously used, for example, when it is desired to make a blue sky in a landscape picture to appear more ultramarine or it is desired to eliminate reflection components in a show window.

In general, in order to separate polarization components and non-polarization components, a polarizing (PL) filter is provided at the frontside of a lens and photography is performed with the polarization components being emphasized or attenuated through rotation of the polarizing filter. In terms of usability, however, such a scheme has some problems, for example, as follows.

[1] The polarization filter can only obtain polarization components in one direction at the same time.

[2] Only one type (one direction) polarization information can be obtained with the entire screen.

[3] Emphasis and attenuation of polarization components generally have to be adjusted through rotation of the polarizing filter.

The number of solid-state image-capture element pixels for use in the above-described two-dimensional solid-state image capture device typically exceeds 10 millions. Due to a lithography-based microfabrication technology with advancement and improvement of semiconductor manufacturing processes, microstructures on a sub-100-nanometer scale have become feasible. Based on such a technological background, development and study of a solid-state image capture element that is capable of simultaneously obtaining polarization information, in addition to the capability of general photography, are also underway.

For example, Japanese Unexamined Patent Application Publication No. 2007-086720 discloses a device that simultaneously obtains polarization directions in four directions and intensities regarding polarization components (the intensities may hereinafter be referred to as "polarization component intensities") to thereby obtain a polarization direction and a polarization component intensity. Japanese Unexamined Patent Application Publication (Translation of PCT Application) No. 2007-501391 discloses a method and an optical element which cause surface plasmon polaritons in a wire grid (a conductor lattice).

Wire-grid polarization members have been used in a band of electromagnetic waves (e.g., mainly, microwaves, millimeter waves, and sub-millimeter waves) having longer wavelengths than visible-light wavelengths and have long been available as elements for separating frequencies and obtaining polarization components. In order to perform polarization component separation by using wire-grid polarization members, it is generally necessary to provide a wire grid with an interval (pitch) that is substantially the same as or smaller than the wavelength of electromagnetic waves. Thus, until recent years, it had been difficult to realize polarization members that are suitable for use in a visible-light wavelength band with wavelengths of 400 to 700 nm. However, with advancement and improvement of semiconductor manufacturing processes, polarization members that have reached the sufficiently practicable level even in a visible-light wavelength band are currently available. Future application of such wire-grid (conductor-lattice) polarization members is expected.

SUMMARY OF THE INVENTION

The technology disclosed in Japanese Unexamined Patent Application Publication No. 2007-086720 is mainly aimed to use, as a polarization member, a multilayer film (photonic crystal) in which two types of optical member having different refractive indices are stacked in an incident-light propagation direction, in order to obtain a polarization direction and a polarization component intensity. The multilayer film has a basic structure with an optical film thickness corresponding to one-fourth the incident wavelength. That is, one period of the multilayer film corresponds to the optical film thickness of a half wavelength. Such periodic structures are stacked to have about 10 layers in order to realize a polarization-light detection function, the thickness of the polarization member becomes at least a few micrometers. As the thickness of the polarization element increases, oblique-incident-light-induced color mixture with neighborhood pixels and a sensitivity decrease due to attenuation/diffusion of light propagating in a medium become more problematic. Japanese Unexamined Patent Application Publication No. 2007-086720 proposes the use of a wire grid (a conductor lattice) as the polarization member, but includes no specific description on the material, the line width, the arrangement position, and so on of the wire grid. Hence, the technology lacks feasibility. On the other hand, Japanese Unexamined Patent Application Publication (Translation of PCT Application) No. 2007-501391 employs a wire grid (a conductor lattice) as an optical element for a near-field light detection sensor, but is not aimed to obtain polarization information and also does not explain a method for disposing three or more types of polarization element used for obtaining polarization information and an algorithm used for extracting the polarization information.

In the device disclosed in Japanese Unexamined Patent Application Publication No. 2007-086720, one pixel area is constituted by four sub-pixel regions, each having a wire-grid polarization member. Light from the polarization member provided in each sub-pixel region is detected by a photoelectric conversion element. This arrangement has some problems. For example, the amount and intensity of light received by the photoelectric conversion element included in each sub-pixel region decreases (i.e., the sensitivity decreases) compared to a case in which no polarization member is provided. Moreover, the rate of decrease varies from one sub-pixel region to another. Additionally, the computation processing for the amount and intensity of light received by the photoelectric conversion element in each sub-pixel region becomes complicated. In the devices disclosed in the above-described publications, no description has been given of the positional relationship between the wire-grid polarization member and a wiring layer for controlling an operation of the photoelectric conversion element, the positional relationship between the wire-grid polarization member and a light-shielding layer for controlling (restricting) incidence of light on the photoelectric conversion element, and the positional relationship between the wire-grid polarization member and a color filter.

Accordingly, it is desirable to provide a two-dimensional solid-state image capture device having an optimized positional relationship between the wire-grid polarization member and the wiring layer for controlling the operation of the photoelectric conversion element, an optimized positional relationship between the polarization member and the light-shielding layer for controlling (restricting) incidence of light on the photoelectric conversion element, and an optimized positional relationship between the polarization member and the color filter. It is also desirable to provide a two-dimensional solid-state image capture device having a configuration and a structure with which a decrease in the sensitivity is unlikely. It is further desirable to provide a polarization-light data processing method that is applied for a two-dimensional solid-state image capture device having a configuration and a structure with which a decrease in the sensitivity is unlikely and that does not complicate computation processing for the amount and intensity of light received by the photoelectric conversion element.

A two-dimensional solid-state image capture device according to first to fourth modes of the present invention includes: pixel areas arranged in a two-dimensional matrix, each pixel area being constituted by multiple sub-pixel regions, each sub-pixel region having a photoelectric conversion element. The polarization member has strip-shaped conductive light-shielding material layers and slit areas, provided between the strip-shaped conductive light-shielding material layers, to transmit light having a polarization component in a direction perpendicular to a direction in which the strip-shaped conductive light-shielding material layers extend and to suppress transmission of light having a polarization component in a direction parallel to the direction in which the strip-shaped conductive light-shielding material layers extend.

In the two-dimensional solid-state image capture device according to the first mode of the present invention, a polarization member is disposed at a light incident side of at least one of the sub-pixel regions constituting each pixel area, each sub-pixel region further has a wiring layer for controlling an operation of the photoelectric conversion element, and the polarization member and the wiring layer are made of the same material and are disposed on the same virtual plane.

In the two-dimensional solid-state image capture device according to the second mode of the present invention, a polarization member is disposed at a light incident side of at least one of the sub-pixel regions constituting each pixel area, each sub-pixel region further has a light-shielding layer for controlling (restricting) incidence of light on the photoelectric conversion element, and the polarization member and the light-shielding layer are disposed on the same virtual plane.

In the two-dimensional solid-state image capture device according to the third mode of the present invention, a polarization member is disposed at a light incident side of one of the sub-pixel regions constituting each pixel area, a color filter is disposed at a light incident side of a remaining sub-pixel region, and the color filter and the polarization member are disposed on the same virtual plane.

In the two-dimensional solid-state image capture device according to the fourth mode of the present invention, a polarization member is disposed at a light incident side of one of the sub-pixel regions constituting each pixel area, and a pixel-area group is constituted by Q0 pixel areas (where $Q0 \geq 3$) and satisfies $$\theta q = \theta 1 + (180/Q) \times (q-1)\text{(degree)},$$

where Q indicates a positive integer (where $3 \leq Q \leq Q0$), $\theta 1$ indicates an angle defined by a predetermined direction and a direction in which the strip-shaped conductive light-shielding material layers extend in the polarization member in the sub-pixel region included in the q-th pixel area (where q=1), and $\theta q$ indicates an angle defined by a predetermined direction and a direction in which the strip-shaped conductive light-shielding material layers extend in the polarization member in the sub-pixel region included in the q-th pixel area (where $2 \leq q \leq Q$) selected from the Q−1 pixel areas selected from the pixels areas other than the first pixel area.

A polarization-light data processing method for a two-dimensional solid-state image capture device according to a first or second mode of the present invention includes is directed to a two-dimensional solid-state image capture device including pixel areas arranged in a two-dimensional matrix, each pixel area being constituted by multiple sub-pixel regions, each sub-pixel region having a photoelectric conversion element. A polarization member is disposed at a light incident side of one of the sub-pixel regions constituting each pixel area. The polarization member has strip-shaped conductive light-shielding material layers and slit areas, provided between the strip-shaped conductive light-shielding material layers, to transmit light having a polarization component in a direction perpendicular to a direction in which the strip-shaped conductive light-shielding material layers extend and to suppress transmission of light having a polarization component in a direction parallel to the direction in which the strip-shaped conductive light-shielding material layers extend. A pixel-area group is constituted by Q0 pixel areas (where Q0≥3) and satisfies $$\theta q=\theta 1+(180/Q)\times(q-1)(\text{degree}),$$

where Q indicates a positive integer (where 3≤Q≤Q0), $\theta 1$ indicates an angle defined by a predetermined direction and a direction in which the strip-shaped conductive light-shielding material layers extend in the polarization member in the sub-pixel region included in the q-th pixel area (where q=1), and $\theta q$ indicates an angle defined by a predetermined direction and a direction in which the strip-shaped conductive light-shielding material layers extend in the polarization member in the sub-pixel region included in the q-th pixel area (where 2≤q≤Q) selected from the Q−1 pixel areas selected from the pixels areas other than the first pixel area.

The polarization-light data processing method for the two-dimensional solid-state image capture device according to the first mode of the present invention includes the steps of determining, as an angle $\theta$max at which a maximum value in a sine function obtained based on a light intensity Iq is obtained, a polarization direction $\theta$PL-max in which a maximum polarization intensity IPL-max of light that is incident on the pixel area is obtained, wherein the light intensity Iq represents a light intensity of light that is incident on the sub-pixel region that has the polarization member and that is included in the q-th pixel area (where q=1, 2, ..., Q); and using the determined maximum value and a minimum value in the sine function as the maximum polarization intensity IPL-max and a minimum polarization intensity IPL-min of light that is incident on the pixel area.

The polarization-light data processing method for the two-dimensional solid-state image capture device according to the second mode of the present invention includes the steps of: using, as a maximum polarization intensity IPL-max of light that is incident on the pixel area, a maximum value Imax of a light intensity Iq of light that is incident on the sub-pixel region that has the polarization member and that is included in the q-th pixel area (where q=1, 2, ..., Q); using, as a polarization direction $\theta$PL-max in which the maximum polarization intensity IPL-max of light that is incident on the pixel area is obtained, an angle $\theta q$ of the pixel area where the maximum value Imax is obtained; and using a minimum value Imin of the light intensity Iq as a minimum polarization intensity IPL-min of light that is incident on the pixel area.

In the two-dimensional solid-state image capture device according to the first mode of the present invention, the polarization member and the wiring member for controlling the operation of the photoelectric conversion element are made of the same material and are disposed on the same virtual plane. Thus, the wiring layer and the polarization member can be simultaneously formed in the same process. That is, the positional relationship between the wire-grid polarization member and the wiring layer in the manufacturing process is optimized, thus making it possible to provide the polarization member without an increase in the number of manufacturing processes and making it possible to reduce the manufacturing cost of the two-dimensional solid-state image capture device. In the two-dimensional solid-state image capture device according to the second mode of the present invention, the polarization member and the light-shielding layer for controlling (restricting) incidence of light on the photoelectric conversion element are disposed on the same virtual plane. Thus, the light-shielding layer and the polarization member can be simultaneously formed in the same process. That is, the positional relationship between the wire-grid polarization member and the light-shielding layer in the manufacturing process is optimized, thus making it possible to reduce the manufacturing cost of the two-dimensional solid-state image capture device. Thus, the two-dimensional solid-state image capture device according to the first or second mode of the present invention can be manufactured using a general semiconductor-device manufacturing process. Moreover, since it is not necessary to add another layer for the polarization member, it is possible to achieve a lower-profile structure of the two-dimensional solid-state image capture device. The provision of the polarization member also does not involve an increase in the thickness of the two-dimensional solid-state image capture device. In addition, in the two-dimensional solid-state image capture device in the third mode of the present invention, the color filter and the polarization member are disposed on the same virtual plane. Thus, it is unlikely that the height of the sub-pixel region having the polarization member and the height of another sub-pixel region having the color filters differ from each other. Since the thickness of the polarization member in the two-dimensional solid-state image capture device in each of the first to third modes of the present invention can be reduced to as small as about 0.1 μm, it is possible to more realizably achieve a lower-profile structure of the two-dimensional solid-state image capture device.

The polarization member transmits only polarization components in a particular direction and reflects and absorbs other polarization components. Thus, the sub-pixel region having the polarization member has a problem in that the sensitivity decreases compared to the sub-pixel region having no polarization member. In the two-dimensional solid-state image capture device according to the fourth mode of the present invention and the two-dimensional solid-state image capture device in the polarization-light data processing method according to the first or second mode of the present invention, the polarization member is disposed at the light incident side of one of the multiple (M0) sub-pixel regions constituting each pixel area and Q polarization members (where Q≤Q0) are disposed in the pixel-area group constituted by Q pixel areas (where Q0≥3). That is, only Q polarization members are disposed in the total of Q0×M0 sub-pixel regions constituting one pixel-area group. Consequently, it is possible to minimize a sensitivity reduction due to the arrangement of the polarization members in the entire pixel area. Determination of the polarization direction and the intensity of polarization components (the polarization component intensity) at the position of each pixel area by performing inter-pixel-area computation processing makes it possible to obtain polarization information with the spatial resolution being slightly compromised, while minimizing a reduction in the sensitivity. Since only Q polarization members are disposed in the total of Q0×M0 sub-pixel regions constituting one pixel-area group, the computation processing for the amount and intensity of light received by the photoelectric conversion elements does not become complicated.

A system in which one polarizing filter is disposed over the entire surface of a lens has been mainly used as a polarizing filter. Therefore, polarization components in only one direction can be obtained for a single image, and thus, the polarizing filter typically has to be rotated to obtain multiple images in order to obtain information of the polarization component intensity and the polarization direction. That is, it is practically very difficult to obtain information of the polarization component intensity, the polarization direction, and so on in real time. Also, in the two-dimensional solid-state image capture device of the present invention, the polarization members having different azimuths are disposed in the pixel areas. Thus, it is possible to obtain information of the polarization direction and the polarization component intensity from a single image and it is also possible to individually obtain information of the polarization directions and the polarization component intensities from various areas and portions in a single image.

BRIEF DESCRIPTION OF THE DRAWINGS

FIG. 10 schematically shows another plan layout view of the sub-pixel regions in the first embodiment;

FIG. 13 is a conceptual view illustrating light that passes through a wire-grid (conductor-lattice) polarization member and so on.

DESCRIPTION OF THE PREFERRED EMBODIMENTS

Figure 1A:
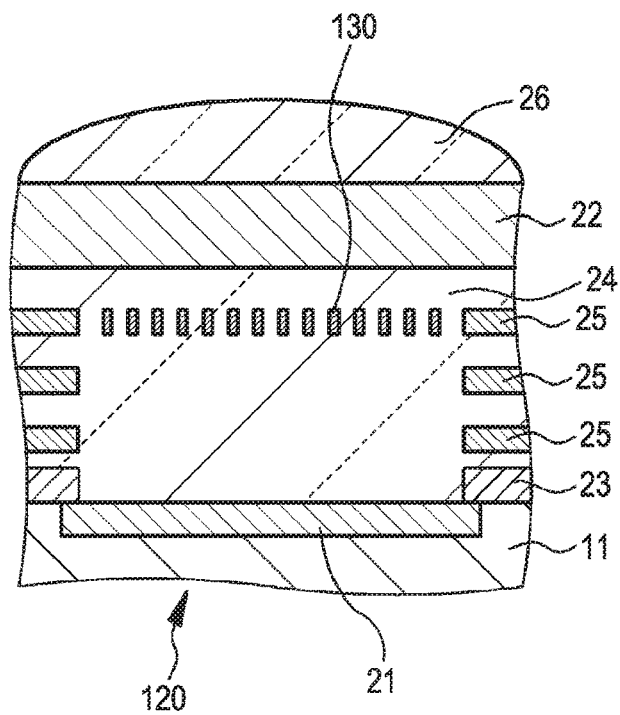
FIGS. 1A and 1B are partial cross-sectional views schematically showing a two-dimensional solid-state image capture device in a first embodiment.

The present invention will be described below in conjunction with embodiments with reference to the accompanying drawings. The present invention, however, is not limited to the embodiments and various numeric values and materials in the embodiments are illustrative. A description below is given in the following sequence:

1. Two-Dimensional Solid-State Image Capture Device according to First to Fourth Modes of Present Invention, Polarization-light data processing Method for Two-Dimensional Solid-State Image Capture Device according to First and Second Modes of Present Invention, and Overall Technology, 2. First Embodiment (Two-Dimensional Solid-State Image Capture Device according to First and Fourth Modes of Present Invention and Polarization-light data processing Method for Two-Dimensional Solid-State Image Capture Device according to First Mode of Present Invention), 3. Second Embodiment (Polarization-light data processing Method for Two-Dimensional Solid-State Image Capture Device according to Second Mode of Present Invention), 4. Third Embodiment (Two-Dimensional Solid-State Image Capture Device according to Second Mode of Present Invention), and 5. Fourth Embodiment (Two-Dimensional Solid-State Image Capture Device according to Third Mode of Present Invention, Etc.).

[Two-Dimensional Solid-State Image Capture Device according to First to Fourth Modes of Present Invention, Polarization-light data processing Method for Two-Dimensional Solid-State Image Capture Device according to First and Second Modes of Present Invention, and Overall Technology]

In a two-dimensional solid-state image capture device according to first to fourth modes of the present invention and a two-dimensional solid-state image capture device in a polarization-light data processing method according to first and second modes of the present invention, multiple pixel areas are generally arranged in a two-dimensional matrix in an X direction and a Y direction.

In the two-dimensional solid-state image capture device according to the second mode of the present invention, each sub-pixel region may have at least one wiring layer for controlling an operation of a photoelectric conversion element, and a polarization member and the wiring layer may be made of the same material and may be disposed on the same virtual plane. In such a case, it is preferable to use a color filter having a conductor-lattice structure.

In the two-dimensional solid-state image capture device according to the fourth mode of the present invention and the polarization-light data processing method for the two-dimensional solid-state image capture device according to the first and second modes of the present invention, Q may be 4 but is not limited thereto. In this case, for Q=4, it follows that: $\theta_2=\theta_1+45$ (degree), $\theta_3=\theta_1+90$ (degree), and $\theta_4=\theta_1+135$ (degree). For Q=3, it follows that: $\theta_2=\theta_1+60$ (degree) and $\theta_3=\theta_1+120$ (degree). For Q=6, it follows that: $\theta_2=\theta_1+30$ (degree), $\theta_3=\theta_1+60$ (degree), $\theta_4=\theta_1+90$ (degree), $\theta_5=\theta_1+120$ (degree), and $\theta_6=\theta_1+150$ (degree). For a configuration with Q0=4, for example, each pixel-area group can be constituted by four (2×2) pixel areas; for a configuration with Q0=6, each pixel-area group can be constituted by six (2×3) pixel areas; and for a configuration with Q0=9, each pixel-area group can be constituted by nine (3×3) pixel areas.

The two-dimensional solid-state image capture device according to the fourth mode of the present invention including the above-described preferred configuration or the two-dimensional solid-state image capture device in the polarization-light data processing method according to the first and second modes of the present invention can also be combined with the two-dimensional solid-state image capture device according to the first mode of the present invention. That is, the sub-pixel regions may also take a form in which each sub-pixel region has at least one wiring layer for controlling the operation of the photoelectric conversion element and the polarization member and the wiring layer are made of the same material and are disposed on the same virtual plane. Alliteratively, the two-dimensional solid-state image capture device according to the fourth mode of the present invention including the above-described preferred configuration or the two-dimensional solid-state image capture device in the polarization-light data processing method according to the first and second modes of the present invention can be combined with the two-dimensional solid-state image capture device according to the second mode of the present invention. That is, the sub-pixel regions may also take a form in which each sub-pixel region has a light-shielding layer for controlling (restricting) incidence of light on the photoelectric conversion element and the polarization member and the light-shielding layer are disposed on the same virtual plane. Alliteratively, the two-dimensional solid-state image capture device according to the fourth mode of the present invention including the above-described preferred configuration or the two-dimensional solid-state image capture device in the polarization-light data processing method according to the first and second modes of the present invention can be combined with the two-dimensional solid-state image capture device according to the third mode of the present invention. That is, the sub-pixel regions may also take a form in which a color filter is disposed at the light incident side of the sub-pixel region having no polarization member and the color filter and the polarization member are disposed on the same virtual plane.

In the polarization-light data processing method for the two-dimensional solid-state image capture device according to the first mode of the present invention, the two-dimensional solid-state image capture device may take a form in which the direction and the intensity of polarization components (the intensity may be referred to as a "polarization component intensity") of light that is incident on, of the sub-pixel regions constituting each pixel area, the sub-pixel region having no polarization member are corrected based on the light intensity IPL-max and/or the light intensity IPL-min. In this case, it is preferable that the direction and the intensity of the polarization components (the polarization component intensity) of light that is incident on, of the sub-pixel regions constituting each pixel area, the sub-pixel region having no polarization member be corrected based on the light intensity IPL-max and/or the light intensity IPL-min derived from the sub-pixel regions that have the polarization members and that are located in the vicinity of the sub-pixel region having no polarization member. Alternatively, in the polarization-light data processing method for the two-dimensional solid-state image capture device according to the first mode of the present invention, the two-dimension solid-state image capture device may take a form in which the light intensity Iq of light that is incident on the sub-pixel region having the polarization member, the sub-pixel region being included in the q-th pixel area (where q=1, 2, . . . , Q), is corrected based on the light intensities of light that is incident on the neighborhood sub-pixel regions that have no polarization members and that have the same detection wavelength band as the sub-pixel region having the polarization member.

In the two-dimensional solid-state image capture device according to the first to fourth modes of the present invention including the above-described preferred forms and configurations and the two-dimensional solid-state image capture device in the polarization-light data processing method according to the first and second modes of the present invention (hereinafter, these devices may collectively be referred to as a "two-dimensional solid-state image capture device of the present invention"), one sub-pixel region has one photoelectric conversion element, which may be implemented as, for example, a CCD, CMOS, or CMD (charge modulation device) signal-amplifying image sensor.

The polarization member (polarization element) in the two-dimensional solid-state image capture device of the present invention has strip-shaped conductive light-shielding material layers and slit areas provided between the conductive light-shielding material layers. Material for the conductive light-shielding material layers may be a conductive material having a complex refractive index that is low in the range of wavelengths to which the photoelectric conversion element is sensitive. Examples of the material include aluminum (Al), copper (Cu), gold (Au), silver (Ag), platinum (Pt), tungsten (W), and an alloy containing such metal. Alternatively, the strip-shaped conductive light-shielding material layers can be provided by arranging line elements, such as carbon nanotubes, in a lattice or can be provided by arranging or printing nanoparticles of gold, silver, CdSe (cadmium selenide), or the like in a lattice. The formation pitch P0 of the strip-shaped conductive light-shielding material layers is, for example, one-half or one-twentieth the wavelength of incident light. The width WS of the slit areas (i.e., a dimension in a direction perpendicular to a direction in which the conductive light-shielding material layers extend) and the width WC of the strip-shaped conductive light-shielding material layers satisfy the relationship of, for example, $0.5WC \le WS \le 5WC$. It is desired that WS be larger than or equal to $5 \times 10^{-8}$ m. Examples of a method for fabricating the polarization member include a technique for depositing conductive light-shielding material layers, a combination of a lithography technique and a conductive light-shielding material-layer patterning technique (e.g., a physical etching technique or an anisotropic etching technique or using carbon tetrafluoride gas, sulfur hexafluoride gas, tifluoromethane, xenon difluoride, or the like) using an etching technique, a combination of a lithography technique and a technique for forming protrusion/depression portions of a base by using an etching technique and for depositing conductive light-shielding material layers at the top surfaces of protrusion portions of the base, and the so-called "lift-off technique". Examples of the method for depositing the conductive light-shielding material layers include, not only physical vapor deposition (PVD) such as vacuum deposition and sputtering, but also chemical vapor deposition (CVD), plating, metalorganic chemical vapor deposition (MOCVD), and molecular beam epitaxy (MBE). Examples of the lithography technique include an electron-beam lithography technique, X-ray lithography, and a photolithography technique (i.e., a lithography technique using a g-ray or i-ray of a high-pressure mercury vapor lamp, a krypton fluoride (KrF) excimer laser, an argon fluoride (ArF) excimer laser, or the like as a light source). Alternatively, the strip-shaped conductive light-shielding material layers can be formed by a nanoimprinting method or a microfabrication technology using an ultra-short-duration pulse laser, such as a femtosecond laser. Each slit area may have an elongated rectangular shape in plan view, but is not limited thereto. For example, each slit area may have a set of rectangular openings. In this case, however, the dimension of the longitudinal axis (i.e., a direction in which the strip-shaped conductor light-shielding material layers extend) of each rectangle generally has to be significantly larger than the effective wavelength of light that has a wavelength of λ0 and that is incident on the slit area (λ0/n0, where n0 denotes the refractive index of a medium contained in the slit area). It is preferable that the slit area be filled with, for example, an incident-light-transmissive medium (dielectric material), such as a silicon oxide film or silicon nitride film. The medium, however, is not limited to this example, and the slit area may be filled with air or nonconductive fluid. When visible light wavelengths are considered by way of example, wavelengths λR, λG, and λB of red, green, and blue are in the range of approximately 600 to 800 nm, 500 to 600 nm, and 380 to 500 nm, respectively. Thus, the wavelengths λ'R, λ'G, and λ'B in the medium when the refractive index of the medium is assumed to be 1.5 are in the range of 400 to 530 nm, 330 to 400 nm, and 250 to 330 nm, respectively, and it is desirable that the formation pitch P0 of the strip-shaped conductive light-shielding material layers be one-half the wavelengths λ'R, λ'G, and λ'B or smaller. It is also preferable that the thickness of the conductive light-shielding material layers be 1 µm or less. Since incident light is not shielded if the thickness of the conductive light-shielding material layers is too small, the lower limit of the thickness thereof is preferably set to be large enough to sufficiently shield incident light.

In the two-dimensional solid-state image capture device according to the first and second modes of the present invention, a polarization member is disposed at the light incident side of at least one of multiple (M0) sub-pixel regions constituting each pixel area. More specifically, when the number of sub-pixel regions in which the polarization members are disposed is indicated by m0, it is preferable that the value of m0 be 1. The value of m0, however, is not limited to 1, and may be 2 or more or may be M0 or less.

In the preferred form of two-dimensional solid-state image capture device according to the first mode of the present invention and the two-dimensional solid-state image capture device according to the fourth mode of the present invention, the polarization member and the wiring layer are made of the same material. Specific examples of the material include aluminum (Al) and copper (Cu). The "virtual plane" on which both the polarization member and the wiring layer are disposed refers to a virtual plane containing bumps and dips which can be generated during manufacture.

In the preferred form of the two-dimensional solid-state image capture device according to the second mode of the present invention and the two-dimensional solid-state image capture device according to the fourth mode of the present invention, the light-shielding layer is provided. Specific examples of material for the light-shielding layer include aluminum (Al), copper (Cu), and tungsten (W). Any member that efficiently reflects and absorbs incident light and that has a sufficient light-shielding characteristic can be used as the light-shielding member. The light-shielding layer and the polarization member can also be made of the same material. The "virtual plane" on which both the polarization member and the light-shielding layer are disposed refers to a virtual plane containing bumps and dips which can be generated during manufacture.

In the two-dimensional solid-state image capture device according to the third mode of the present invention and in the two-dimensional solid-state image capture device in the preferred form of the fourth mode of the present invention, a color filter is disposed. The color filter may be a color filter that transmits particular wavelengths, such as those of red, green, blue, cyan, magenta, and yellow. The color filter may be constituted by not only an organic-material-based color filter using an organic compound of a pigment, colorant, or the like, but also a photonic crystal, a conductor grid (a color filter having a conductor-lattice structure in which a latticed-hole structure is provided in a conductor thin film [e.g., refer to Japanese Unexamined Patent Application Publication No. 2008-177191]), or a thin film made of inorganic material such as amorphous silicon. The "virtual plane" on which both the color filter and the polarization member are disposed refers to a virtual plane containing bumps and dips which can be generated during manufacture.

The two-dimensional solid-state image capture device of the present invention is a single-CCD-type device. Examples of the color filter arrangement include a Bayer arrangement, an interline arrangement, a G-striped RB-checkered arrangement, a G-striped and RB-complete-checkered arrangement, a checkered complementary-color arrangement, a stripe arrangement, an oblique-stripe arrangement, a primary-color color-difference arrangement, a field color-difference sequence arrangement, a frame color-difference sequence arrangement, a MOS arrangement, a modified MOS arrangement, a frame interleaved arrangement, and a field interleaved arrangement. For example, in the case of the Bayer arrangement, the arrangement may be such that red, green, and blue color filters are disposed in corresponding three sub-pixel regions of 2×2 sub-pixel regions and the polarization member, not a color filter, is disposed in the remaining one sub-pixel region in which a green color filter is typically supposed to be disposed. In the case of the Bayer arrangement, alternatively, the arrangement may be such that red, green, and blue color filters are disposed in corresponding three sub-pixel regions of 2×2 sub-pixel regions and a green color filter and the polarization member are disposed in the remaining one sub-pixel region. When color separation or spectroscopy is not intended or when a photoelectric conversion element is intrinsically sensitive to a particular wavelength, the filter may be eliminated. For the sub-pixel region in which no color filter is disposed, a transparent resin layer, instead of the color filter, may be provided in order to ensure flatness with the sub-pixel regions in which the color filters are disposed.

In the polarization-light data processing method for the two-dimensional solid-state image capture device according to the first mode of the present invention, the polarization direction θPL-max in which the maximum polarization intensity (the maximum value of the polarization component intensity) IPL-max of light that is incident on the pixel area is determined as an angle θmax at which the maximum value in a sine function obtained based on the light intensity Iq is obtained. The sine function in this case can be determined based on, for example, a Fourier analysis method or a least-squares method. The sine function and a cosine function are equivalent to each other.

The two-dimensional solid-state image capture device according to the first mode of the present invention may be implemented as a frontside-illuminated two-dimensional solid-state image capture device. The two-dimensional solid-state image capture device according to the second to fourth modes of the present invention and the two-dimensional solid-state image capture device in the polarization-light data processing method according to the first and second modes of the present invention may be implemented as frontside-illuminated two-dimensional solid-state image capture devices or backside-illuminated two-dimensional solid-state image capture devices. These two-dimensional solid-state image capture devices can be applied to, for example, digital still cameras, video cameras, and camcorders.

Figure 13:
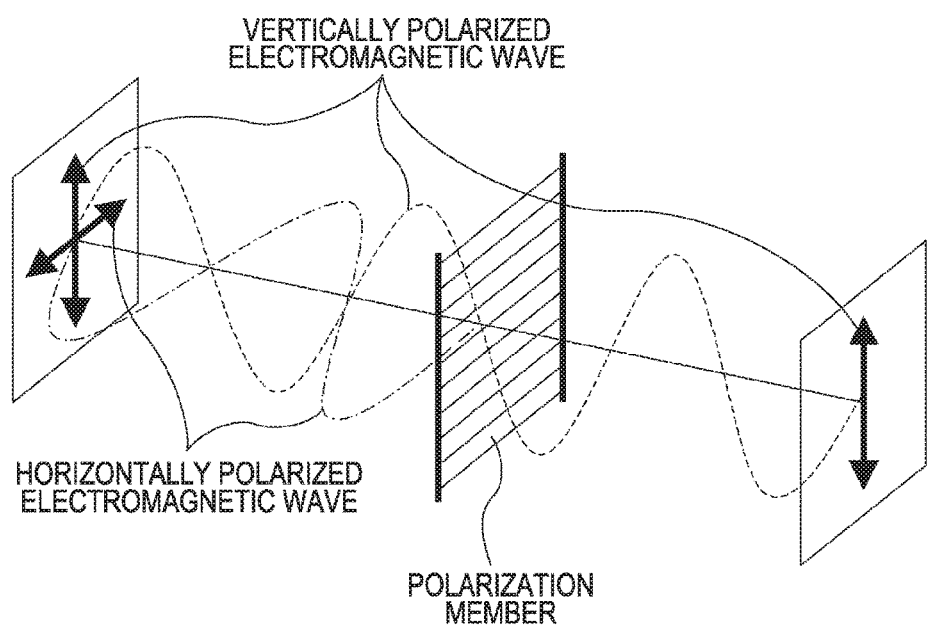

In general, wire-grid (conductor-lattice) polarization members have a one-dimensional or two-dimensional lattice structure made of conductive material. As shown in a conceptual diagram in FIG. 13, when the formation pitch P0 of the wire grid is significantly smaller than the wavelength of incident electromagnetic waves, electromagnetic waves that oscillate in a plane parallel to a direction in which the wire grid extends are selectively reflected or absorbed by the wire grid. Consequently, although the electromagnetic waves that reach the polarization member contain vertically polarized components and horizontally polarized components, electromagnetic waves that have passed through the wire grid have linear polarization light in which vertically polarized components are dominant. In the case of a visible-light wavelength band, when the formation pitch P0 of the wire grid is substantially the same as or smaller than the wavelength of electromagnetic waves that are incident on the wire grid, the polarization components polarized along the plane parallel to the wire-grid extension direction are reflected or absorbed by the surface of the wire grid. On the other hand, it is considered that, when electromagnetic waves having polarization components polarized along a plane perpendicular to the wire-grid extension direction are incident on the wire grid, an electric field that has propagated on the surface of the wire grid causes an electromagnetic wave having the same wavelength as the incident wavelength to be re-radiated from the backside of the wire grid. An interesting phenomenon that light with a longer wavelength than the cut-off frequency determined by the formation pitch P0 of the wire grid is transmitted under a condition that wavelength of the incident electromagnetic wave and the wire-grid period structure satisfy a dispersion relationship for exciting surface plasmon polaritons has also been proposed (T. W. Ebbesen et al., Nature, vol. 391, p 667, 1998). In addition, in the vicinity of the polarization member having a periodic structure equivalent to a visible-light wavelength (i.e., in an area located at a shorter distance from the wire grid than the wavelength of the electromagnetic wave), surface plasmon polaritons are generated as a result of coupling of electromagnetic waves with polarized charge or electrons in material contained in the wire grid. Thus, the electric field changes abruptly to thereby produce near-field light, which is non-propagating light. Although near-field light has only a range comparable to electromagnetic waves, a numeric-simulation result of near-field light forming a very strong electric field is also reported (L. Salomon et al., Physical Review Letters, Vol. 86, No. 6, p 1110, 2001). The polarization member in the two-dimensional solid-state image capture device of the present invention is implemented by such a wire-grid (conductor-lattice) polarization member.

First Embodiment

Figure 1B:
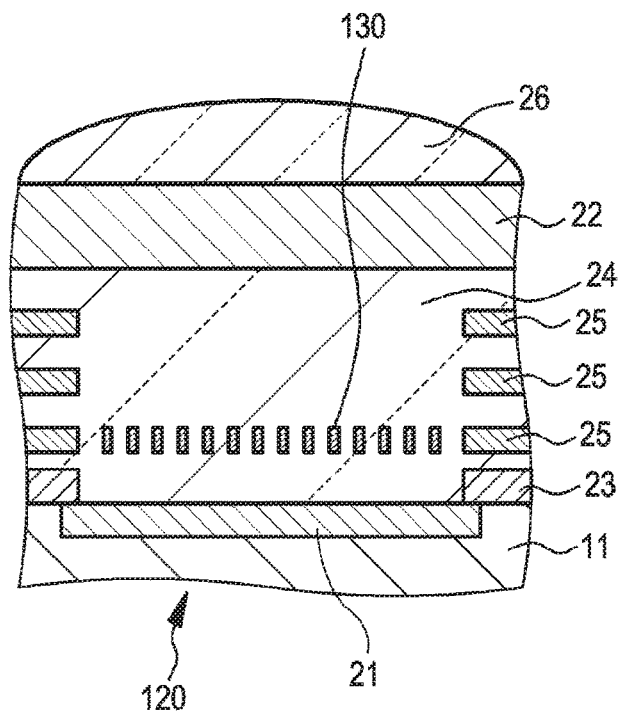

A first embodiment relates to a two-dimensional solid-state image capture device according to a first mode and a fourth mode of the present invention and to a polarization-light data processing method for the two-dimensional solid-state image capture device according to the first mode of the present invention. FIGS. 1A and 1B show partial schematic cross-sectional views of the two-dimensional solid-state image capture device in the first embodiment, FIGS. 5 to 9 schematically show plan layout views of sub-pixel regions 120 in the first embodiment, and FIGS. 4A and 4B are partial plan views of a polarization member 130.

In a two-dimensional solid-state image capture device in the first embodiment or each of the second to fourth embodiments described below, multiple pixel areas are generally arranged in a two-dimensional matrix in an X direction and a Y direction and each pixel area is constituted by multiple (M0) sub-pixel regions 120, where M0=4 in the embodiment. Each sub-pixel region 120 has a photoelectric conversion element (a light receiving element) 21.

Figure 4A:
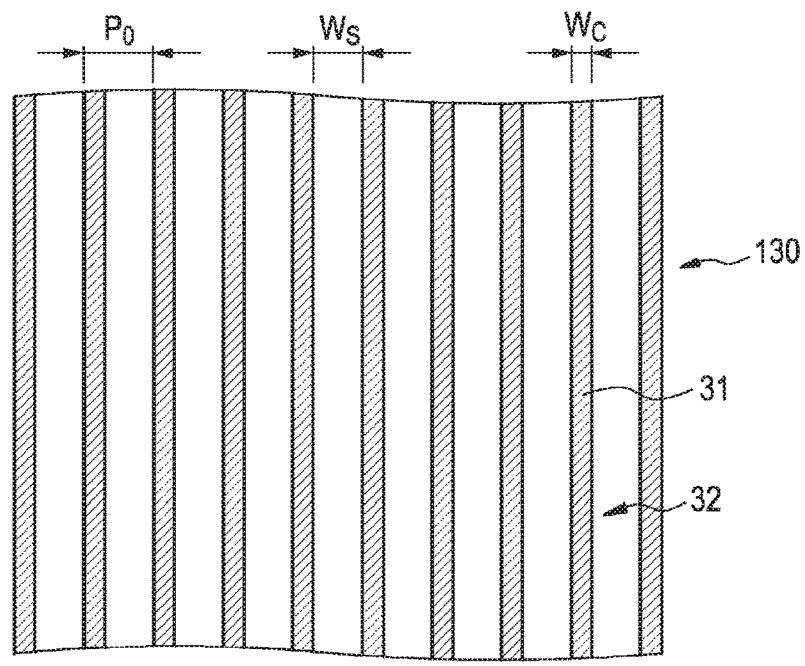
FIGS. 4A and 4B are partial schematic plan views of a polarization member.
Figure 4B:
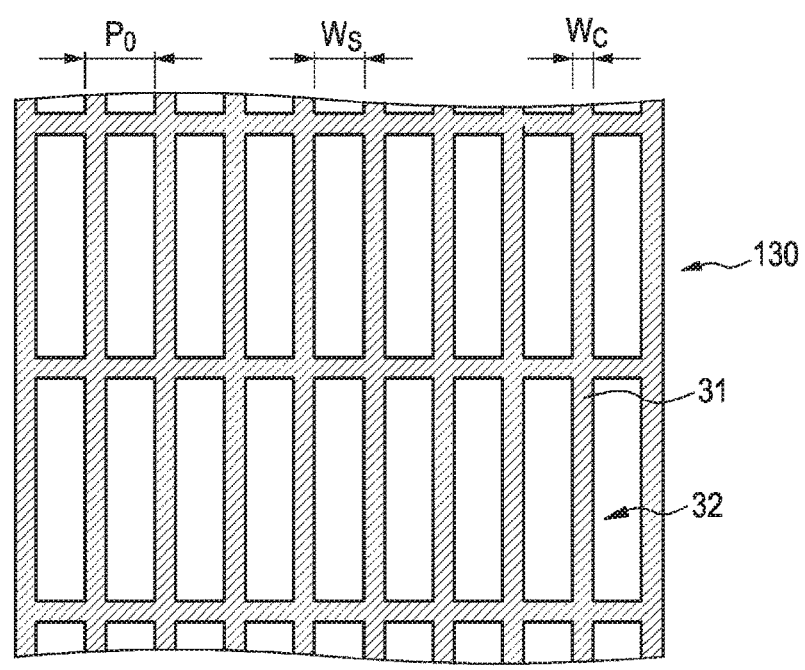

The polarization member 130 has multiple strip-shaped conductive light-shielding material layers 31 and slit areas 32 provided the strip-shaped conductive light-shielding material layers 31, as shown in FIGS. 4A and 4B. The polarization member 130 transmits light having a polarization component in a direction perpendicular to a direction in which the strip-shaped conductive light-shielding material layers 31 extend and suppresses transmission of light having a polarization component in a direction parallel to the direction in which the strip-shaped conductive light-shielding material layers 31 extend, as illustrated in a conceptual view in FIG. 13. That is, the wire-grid polarization member 130 is sensitive to polarization components in the direction perpendicular to the direction in which the strip-shaped conductive light-shielding material layers 31 extend and has no sensitivity to polarization components in the direction parallel to the direction in which the strip-shaped conductive light-shielding material layers 31 extend. The polarization member 130 obtains polarization components in the direction perpendicular to the direction in which the strip-shaped conductive light-shielding material layers 31 extend and eliminates polarization components in the direction parallel to the direction in which the strip-shaped conductive light-shielding material layers 31 extend.

Now, a description is given in conjunction with a two-dimensional solid-state image capture device according to the first mode of the present invention. In the two-dimensional solid-state image capture device in the first embodiment, the polarization member 130 is disposed at the light incident side of at least one (one sub-pixel region 120 in the embodiment, because of m0=1) of the sub-pixel regions 120 constituting each pixel area. In addition, each sub-pixel region 120 has at least one wiring layer 25 for controlling an operation of the photoelectric conversion element 21. The polarization member 130 and the wiring layer 25 are made of the same material and are disposed on the same virtual plane.

A description is now given in conjunction with a two-dimensional solid-state image capture device according to the fourth mode of the present invention or a two-dimensional solid-state image capture device in the polarized data processing method according to the first mode of the present invention. In the first two-dimensional solid-state image capture device in the first embodiment, the polarization member 130 is disposed at a light-incident side of one of the sub-pixel regions 120 constituting each pixel area. A pixel-area group is constituted by Q0 pixel areas (where Q0≥3, and Q0=4 in the embodiment) and satisfies $\theta_q = \theta_1 + (180/Q) \times (q-1)$ (degree), where Q indicates a positive integer (where 3≤Q≤Q0 and Q=1 in the present embodiment), θ1 indicates an angle defined by a predetermined direction and a direction in which the strip-shaped conductive light-shielding material layers extend in the polarization member in the sub-pixel region included in the q-th pixel area (where q=1), and θq indicates an angle defined by a predetermined direction and a direction in which the strip-shaped conductive light-shielding material layers extend in the polarization member in the sub-pixel region included in the q-th pixel area (where $2 \leq q \leq Q$) selected from the Q−1 pixel areas selected from the pixels areas other than the first pixel area. More specifically, the following is given:

θ2=θ1+45 (degree),

θ3=θ1+90 (degree), and

θ4=θ1+135 (degree).

In the embodiment, the photoelectric conversion element 21 is implemented as an electric-field amplifying image sensor (e.g., a CMOS image sensor). The two-dimensional solid-state image capture devices shown in FIGS. 1A and 1B are frontside-illuminated two-dimensional solid-state image capture devices. The polarization member 130 and the wiring layer 25 contain aluminum (Al). In the two-dimensional solid-state image capture device in the first embodiment or each of the second to fourth embodiments described below, electromagnetic waves detected (received) by the photoelectric conversion element 21 are visible light. Each sub-pixel region 120 has a color filter 22, as appropriate. In the frontside-illuminated two-dimensional solid-state image capture devices shown in FIGS. 1A and 1B, light focused by a light-focusing element 26 is guided to the photoelectric conversion element 21 through the color filter 22, a smoothing layer 24, the polarization member 130, and an opening area of a light-shielding layer 23. The smoothing layer 24 is made of transparent material, such as silicon dioxide (SiO2) or (silicon nitride) SiN, and the light-shielding layer 23 is made of copper (Cu) or aluminum (Al). The light is photoelectrically converted into electrical change, which is stored and is then read out as an electrical signal. A substrate 11 may be a silicon substrate. The photoelectric conversion element 21 is provided in the substrate 11. The light focusing element 26 may be implemented by not only an on-chip convex microlens but also a sub-wavelength lens (SWLL) having a periodic structure with a physical scale that is smaller than the wavelength of electromagnetic waves (e.g., visible light) that are incident on the photoelectric conversion element 21. In the example shown in FIG. 5, the sub-pixel region having the polarization member 130 has no color filter.

In the polarization member 130, the formation pitch P0 of the strip-shaped conductive light-shielding material layers 31, the width WS of the slit areas 32, the width WC of the strip-shaped conductive light-shielding material layers 31, and the thickness t0 of the strip-shaped conductive light-shielding material layers 31 may be set such that PS=100 nm, WS=50 nm, WC=50 nm, and t0=50 nm, but are not limited thereto. Each slit area 32 may have an elongated rectangular shape in plan view, as shown in FIG. 4A, or may have a set of rectangular openings, as shown in FIG. 4B. In the latter case, however, it is necessary that the dimension of the longitudinal axis of each rectangle be significantly larger than the effective wavelength (λ0/n0) of light passing through the slit areas 32. The slit areas 32 are filled with the same material as the material contained in the smoothing layer 24.

FIGS. 5 to 9 and FIGS. 10 to 12, which are described below, show plan layout views of the sub-pixel regions 120. In FIGS. 5 to 12, regions denoted by R represent sub-pixel regions having red color filters (i.e., red display sub-pixel regions R), regions denoted by G represent sub-pixel regions having green color filters (i.e., green display sub-pixel regions G), regions denoted by B represent sub-pixel regions having blue color filters (i.e., blue display sub-pixel regions B), and regions denoted by W represent sub-pixel regions having no color filters (i.e., white display sub-pixel regions W). In the first to fourth embodiments, the red display sub-pixel regions R, the green display sub-pixel regions G, and the blue display sub-pixel regions B have no polarization members 130. Each white display sub-pixel region W hatched by horizontal lines is included in a first (q=1) pixel area and has the polarization member, each white display sub-pixel region W hatched by 45° oblique lines is included in a second (q=2) pixel area and has the polarization member, each white display sub-pixel region W hatched by vertical lines is included in a third (q=3) pixel area and has the polarization member, and each white display sub-pixel region W hatched by 135° oblique lines is included in a fourth (q=4) pixel area and has the polarization member. Each area surrounded by dotted lines represents a pixel area and an area surrounded by a dashed-dotted line represents a pixel-area group. The illustrated color-filter arrangement is basically a Bayer arrangement. However, red, green, and blue color filters are disposed in corresponding three sub-pixel regions of 2×2 sub-pixel regions, no color filter is disposed in the remaining one sub-pixel region, and the polarization member 130 is disposed in the remaining one sub-pixel region.

Figure 5:
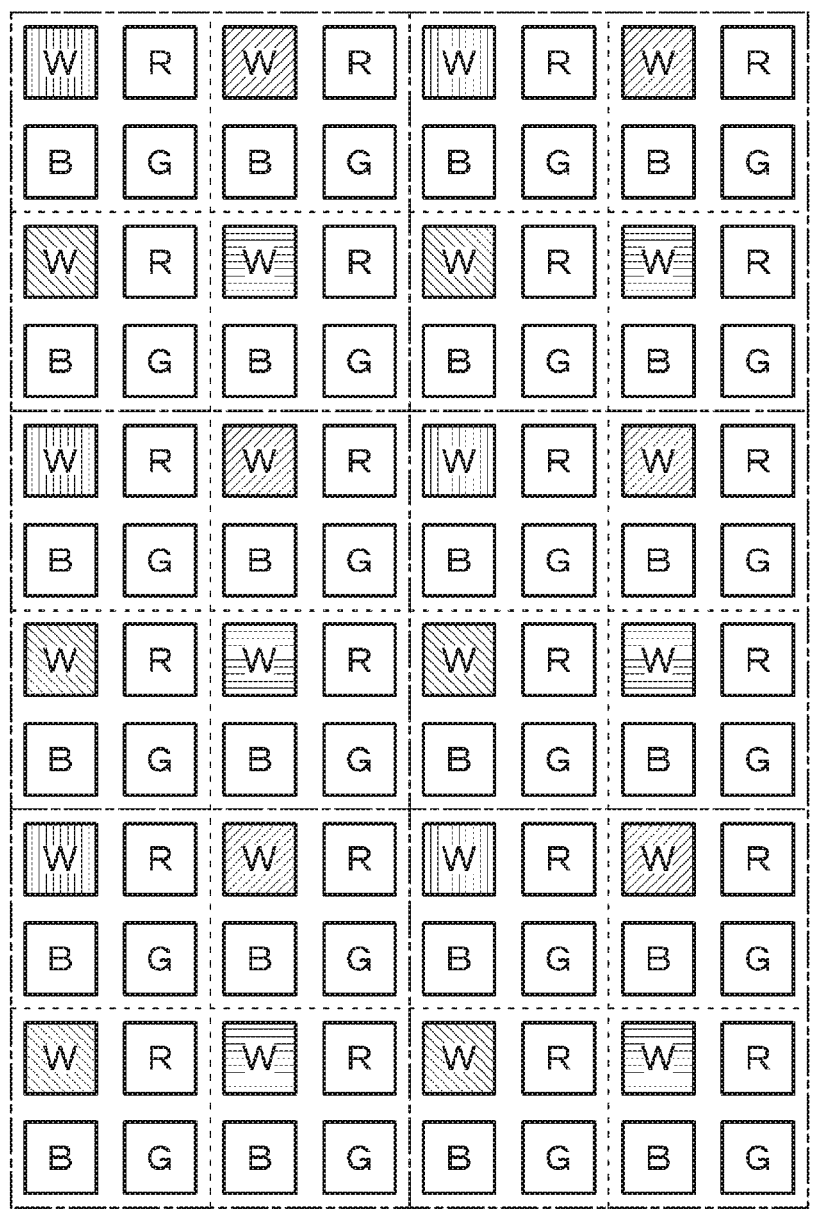
FIG. 5 schematically shows a plan layout view of sub-pixel regions in the first embodiment.

Polarization information is used in, for example, a special photography mode in which, for example, reflection light is eliminated. In general, a spatial resolution that is the same as that for typical image capture is not necessary in many cases. In addition, the sub-pixel region 120 having the polarization member 130 has a structure in which it eliminates some light and thus has a sensitivity that lower than that of the other sub-pixel regions. Arrangement of the polarization members 130 at a particular period as shown in FIG. 5 makes it possible to increase the rate of the sub-pixel regions having no polarization areas and also makes it possible to minimize a decrease in the overall sensitivity of the two-dimensional solid-state image capture device. Although the sub-pixel regions 120 having the polarization members 130 are arranged with one sub-pixel region interposed therebetween in the X and Y directions in FIG. 5, they may be arranged with two or three sub-pixel regions interposed therebetween. The sub-pixel regions 120 having the polarization members 130 may also be arranged in a hound's tooth pattern.

In the polarization-light data processing method for the two-dimensional solid-state image capture device, Iq denotes a light intensity of light that is incident on the sub-pixel region that has the polarization member and that is included in the q-th pixel area (where q=1, 2, ..., Q). A polarization direction θPL-max in which a maximum polarization intensity (i.e., a maximum value of polarization component intensity) IPL-max of light that is incident on the pixel area is obtained is determined as an angle θmax at which a maximum value in a sine function obtained based on the light intensity Iq is obtained and the determined maximum value and a minimum value in the sine function are used as the maximum polarization intensity IPL-max and the minimum polarization intensity (the minimum value of the polarization component intensity) IPL-min of the light that is incident on the pixel area.

Specifically, one pixel-area group is constituted by four (Q0=4) pixel areas, each having one sub-pixel region 120 having the polarization member 130. Accordingly, in the pixel-area group, four incident light intensities Iq (q=1, 2, 3, 4) can be obtained.

Since the electromagnetic waves are oscillating waves, electric fields εx and εy at time t and position z in an X-Y plane perpendicular to a Z axis along which the electromagnetic waves travel can be give by:

$$\varepsilon X = EX \cdot \exp[i(k \cdot z - \omega \cdot t + \delta 1)]$$

$$\varepsilon y = EY \cdot \exp[i(k \cdot z - \omega \cdot t + \delta 2)]$$

where EX denotes an amplitude of components in the X direction, EY denotes an amplitude of components in the Y direction, k denotes a phase constant and is $2\pi/\lambda$, ω represents an angular frequency of the electromagnetic waves, δ1 denotes an initial phase of the components in the X direction, and δ2 denotes an initial phase of the components in the Y direction.

The electromagnetic waves detected are a combination of oscillating waves which can be expressed by those sine functions. Thus, when a particular linear polarization component, circular polarization component, or elliptical polarization component is prominent, the intensity of electromagnetic waves observed using the polarization member 130 in the two-dimensional solid-state image capture device in the first embodiment can be expressed by a sine function in which one period corresponds to an azimuth of 360°. On the other hand, when the polarization components of the electromagnetic waves are completely random, no particular polarization occurs and thus the electromagnetic wave intensity becomes independent from the direction of the polarization members.

That is, as described above, the light intensities Iq obtained from the sub-pixel regions 120 having the polarization members are expressed by a sine function and an angle θmax when the maximum value in the sine function is obtained can be used as the polarization direction θPL-max in which the maximum polarization intensity (the maximum value of the polarization component intensity) IPL-max is obtained. In addition, the determined maximum value and the minimum value in the sine function ca be used respectively as the maximum polarization intensity IPL-max and the minimum polarization intensity (the minimum value of the polarization component intensity) IPL-min of light that is incident on the pixel area. The polarization component intensity IPL can be expressed by:

$$IPL = (IPL\text{-max} - IPL\text{-min})/(IPL\text{-max} + IPL\text{-min}).$$

As shown in FIG. 5, one red display sub-pixel region R is surrounded by eight sub-pixel regions, i.e., a green display sub-pixel region G, a blue display sub-pixel region B, a white display sub-pixel region W, a blue display sub-pixel region B, a green display sub-pixel region G, a blue display sub-pixel region B, a white display sub-pixel region W, and a blue display sub-pixel region B, clockwise from 12 o'clock. One green display sub-pixel region G is surrounded by eight sub-pixel regions, i.e., a red display sub-pixel region R, a white display sub-pixel region W, a blue display sub-pixel region B, a white display sub-pixel region W, a red display sub-pixel region R, a white display sub-pixel region W, a blue display sub-pixel region B, and a white display sub-pixel region W, clockwise from 12 o'clock. One blue display sub-pixel region B is surrounded by a white display sub-pixel region W, a red display sub-pixel region R, a green display sub-pixel region G, a red display sub-pixel region R, a white display sub-pixel region W, a red display sub-pixel region R, a green display sub-pixel region G, and a red display sub-pixel region R. One white display sub-pixel region W is surrounded by a blue display sub-pixel region B, a green display sub-pixel region G, a red display sub-pixel region R, a green display sub-pixel region G, a blue display sub-pixel region B, a green display sub-pixel region G, a red display sub-pixel region R, and a green display sub-pixel region G.

In the polarization-light data processing method in the first embodiment, the direction and the intensity of polarization components of light that is incident on, of the sub-pixel regions constituting each pixel area, the sub-pixel region having no polarization member are corrected based on the light intensity IPL-max and/or the light intensity IPL-min. In addition, the direction and the intensity of the polarization components of light that is incident on, of the sub-pixel regions constituting each pixel area, the sub-pixel region having no polarization member are corrected based on the light intensity IPL-max and/or the light intensity IPL-min derived from the sub-pixel regions that have the polarization members and that are located in the vicinity of the sub-pixel region having no polarization member.

Figure 6:
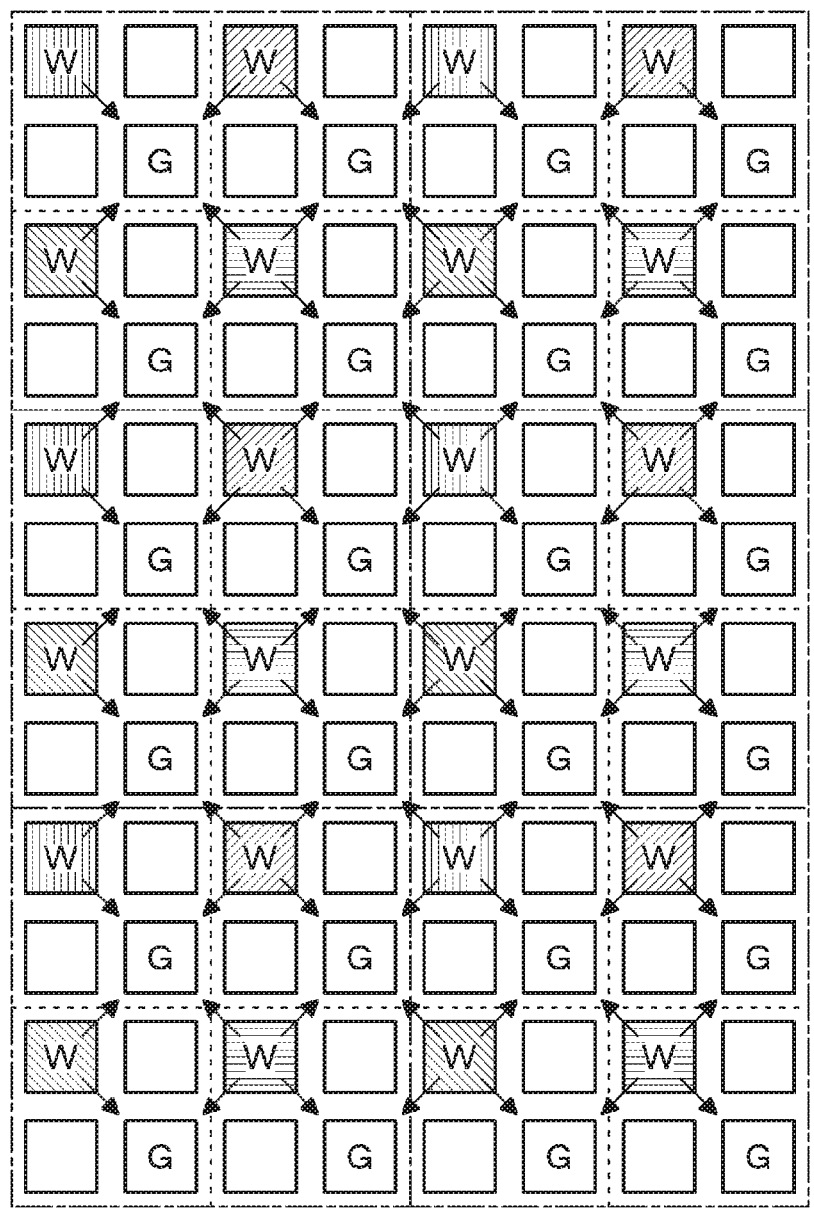
FIG. 6 schematically shows a plan layout view of the sub-pixel regions in the first embodiment.

That is, the direction and the intensity of polarization components of light that is incident on the green display sub-pixel region G are corrected based on the light intensity IPL-max and the light intensity IPL-min derived from the white display sub-pixel regions W located in the vicinity of the green display sub-pixel region G. More specifically, as shown in FIG. 6, the polarization information of the green display sub-pixel region G are obtained from a polarization direction and a polarization component intensity determined from the polarization information of four neighborhood white display sub-pixel regions W (i.e., four white display sub-pixel regions W located to the upper right, lower right, lower left, and upper left of the green display sub-pixel region G). On the basis of the light intensities Iq obtained from the four white display sub-pixel regions W, θPL-max, IPL-max, IPL-min, and IPL of the green display sub-pixel region G can be obtained.

Figure 7:
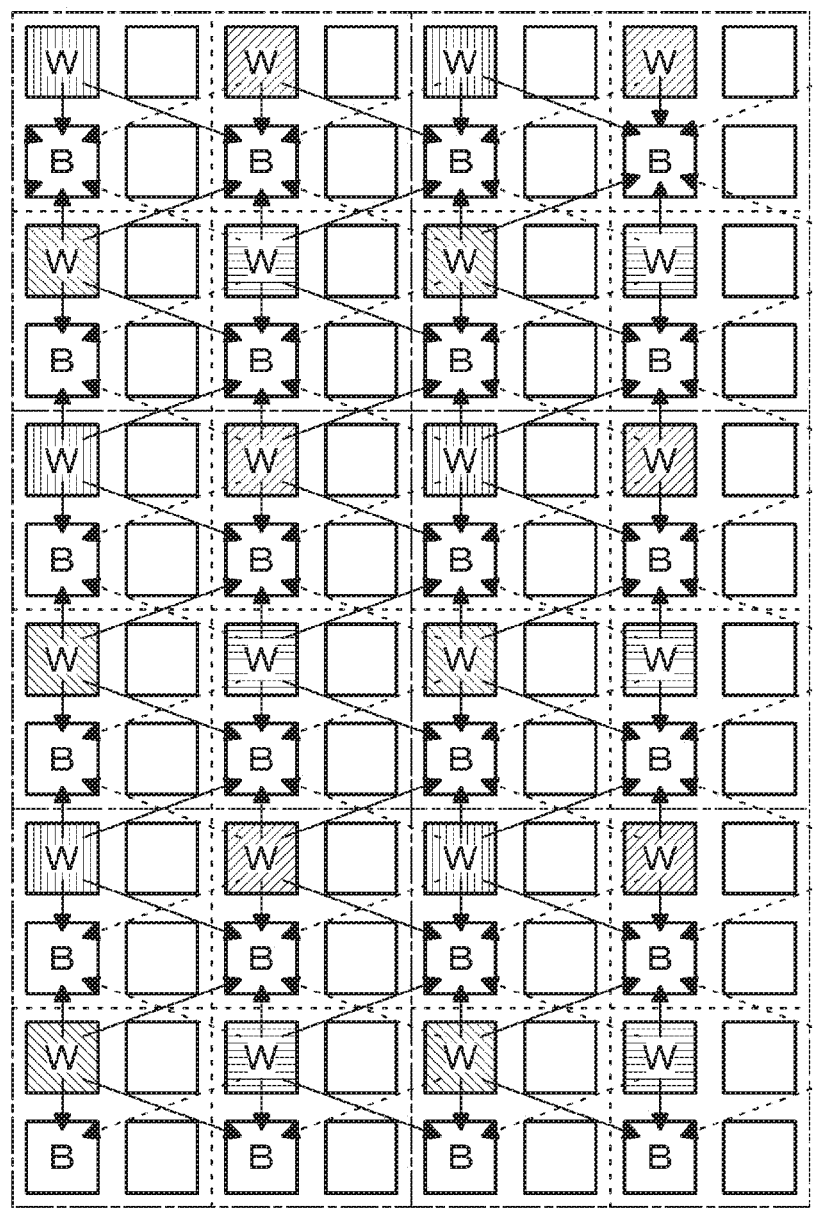
FIG. 7 schematically shows a plan layout view of the sub-pixel regions in the first embodiment.

Similarly, the direction and the intensity of polarization components of light that is incident on the blue display sub-pixel region B are corrected based on the light intensity IPL-max and the light intensity IPL-min derived from the white display sub-pixel regions W located in the vicinity of the blue display sub-pixel region B. More specifically, as shown in FIG. 7, the polarization information of the blue display sub-pixel region B is obtained from a polarization direction and a polarization component intensity determined from the polarization information of four neighborhood white display sub-pixel regions W (i.e., four white display sub-pixel regions W located immediately above, immediately below, to the lower left of, and to the upper left of the blue display sub-pixel region B). The polarization information of the blue display sub-pixel region B may be obtained from a polarization direction and a polarization component intensity determined from the polarization information of a total of six neighborhood white display sub-pixel regions W further including two neighborhood white display sub-pixel regions W located to the lower right and upper right of the blue display sub-pixel region B. On the basis of the light intensities Iq obtained from the four (or six) white display sub-pixel regions W, θPL-max, IPL-max, IPL-min, and IPL of the blue display sub-pixel region B can be obtained.

Figure 8:
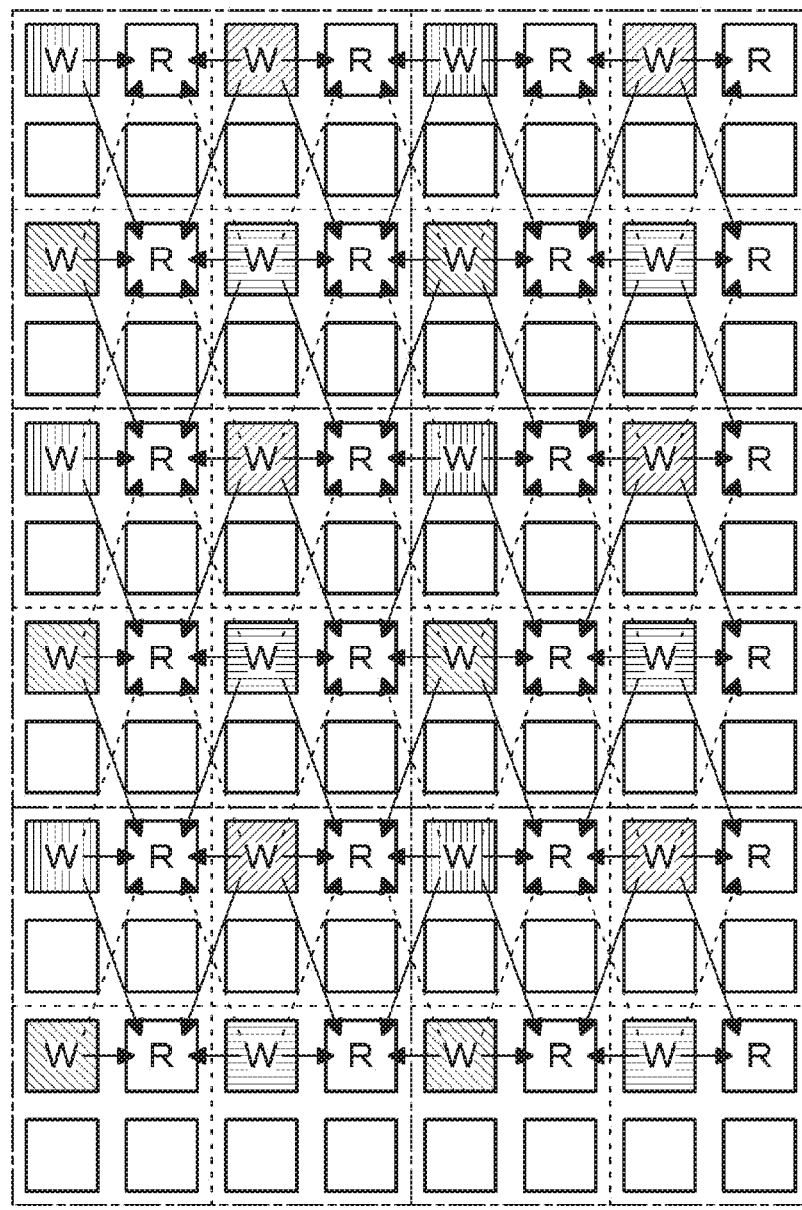
FIG. 8 schematically shows a plan layout view of the sub-pixel regions in the first embodiment.

Similarly, the direction and the intensity of polarization components of light that is incident on the red display sub-pixel region R are corrected based on the light intensity IPL-max and the light intensity IPL-min derived from the white display sub-pixel regions W located in the vicinity of the red display sub-pixel region R. More specifically, as shown in FIG. 8, the polarization information of the red display sub-pixel region R is obtained from a polarization direction and a polarization component intensity determined from the polarization information of four neighborhood white display sub-pixel regions W (i.e., four white display sub-pixel regions W located to the upper right, immediately right, immediately left, and upper left of the red display sub-pixel region R). The polarization information of the red display sub-pixel region R may be obtained from a polarization direction and a polarization component intensity determined from the polarization information of a total of six neighborhood white display sub-pixel regions W further including two neighborhood white display sub-pixel regions W located to the lower right and lower left of the red display sub-pixel region R. On the basis of the light intensities Iq obtained from the four (or six) white display sub-pixel regions W, θPL-max, IPL-max, IPL-min, and IPL of the red display sub-pixel region R can be obtained.

Figure 9:
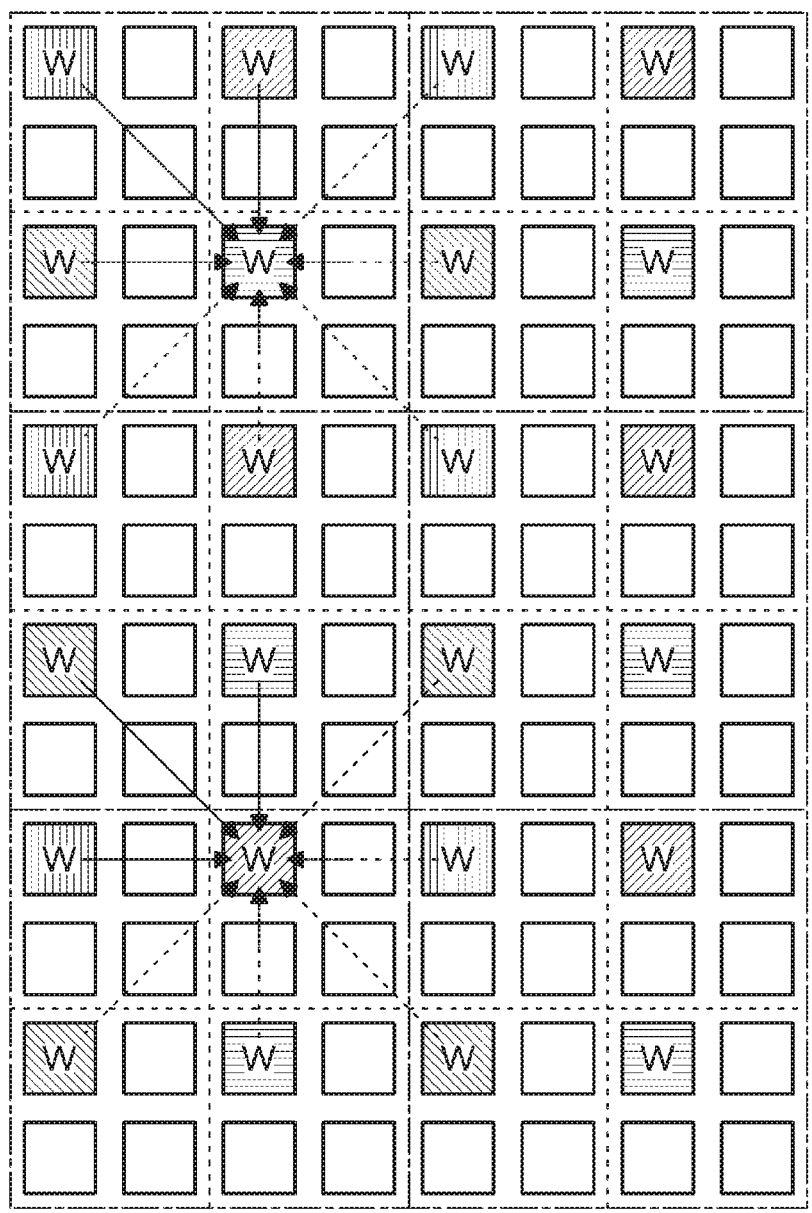
FIG. 9 schematically shows a plan layout view of the sub-pixel regions in the first embodiment.
Figure 11:
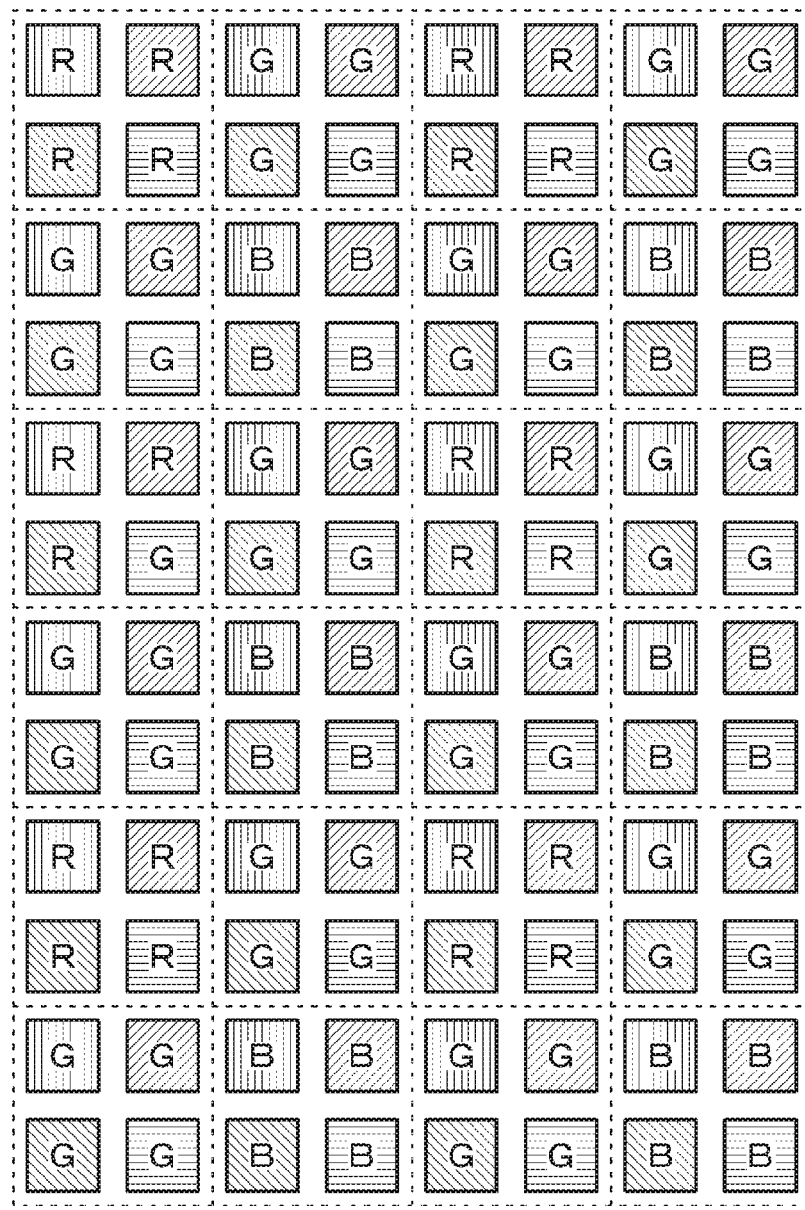
FIG. 11 schematically shows a plan layout view of sub-pixel regions in a two-dimensional solid-state image capture device to which the two-dimensional solid-state image capture devices according to the first to third modes of the present invention are applicable.
Figure 12:
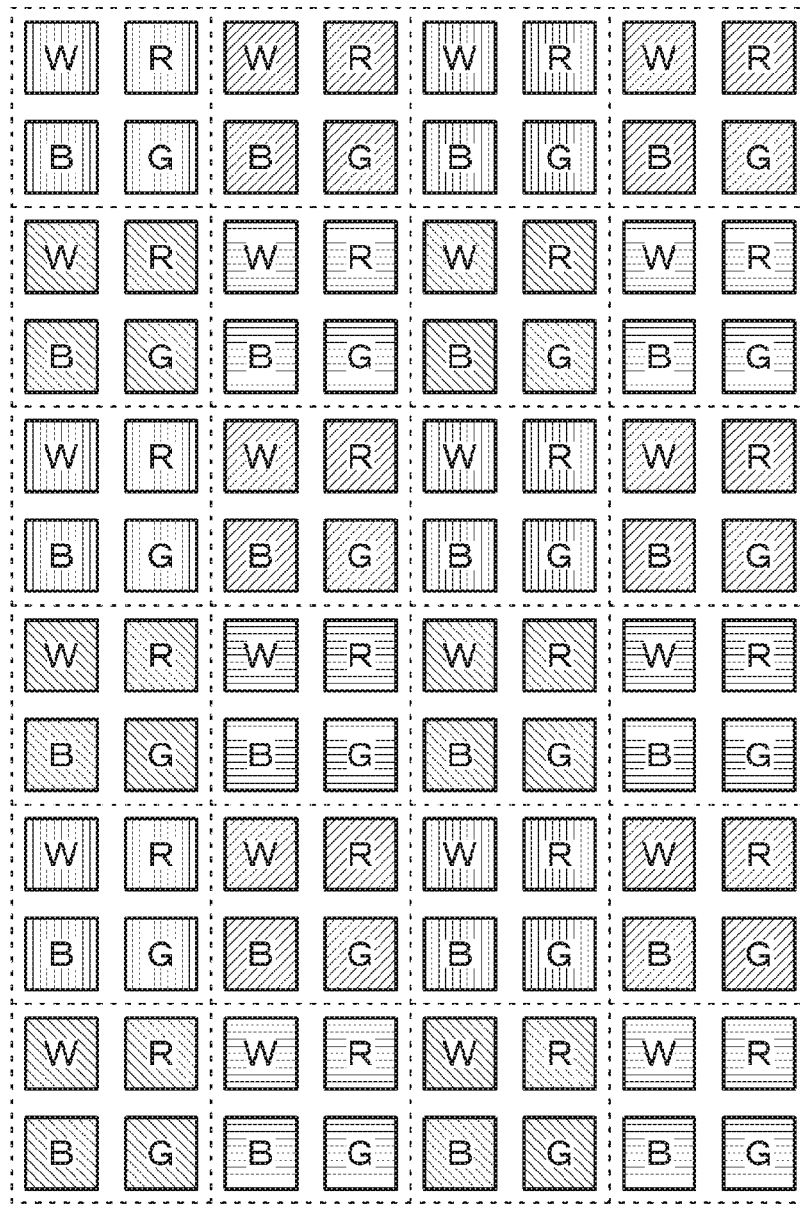
FIG. 12 schematically shows another plan layout view of the sub-pixel regions in the two-dimensional solid-state image capture device to which the two-dimensional solid-state image capture devices according to the first to third modes of the present invention are applicable.

Similarly, as shown in FIG. 9, the polarization information of the white display sub-pixel region W located at the center is obtained from a polarization direction and a polarization-light component intensity obtained from the polarization information of three neighborhood white display sub-pixel regions W (i.e., three white display sub-pixel regions W located immediately above, to the immediately left of, and to the upper left of the white display sub-pixel region W) and the polarization information of the white display sub-pixel region W located at the center. The polarization information of the white display sub-pixel region W located at the center may also be obtained from a polarization direction and a polarization component intensity determined from the polarization information of a total of eight neighborhood white display sub-pixel regions W further including five white display sub-pixel regions W located to the upper right of, to the immediate right of, to the lower right of, immediately below, and to the lower left of the white display sub-pixel region W. On the basis of the light intensities Iq obtained from the three (or eight) white display sub-pixel regions W, θPL-max, IPL-max, IPL-min, and IPL of the white display sub-pixel region W located at the center can be obtained. FIG. 9 illustrates polarization information of the white sub-pixel regions W located at only two centers.

That is, as a result of the above-described processes, the polarization component intensities and the polarization directions of the sub-pixel regions can be obtained, and also a two-dimensional map of polarization light component intensities (IPL), a two-dimensional map of azimuths (θ) of polarization light, a two-dimensional map of maximum polarization-light intensities (the maximum values of polarization component intensities) IPL-max, and a two-dimensional map of minimum polarization intensities (the minimum values of polarization component intensities) IPL-min can be obtained. In this case, with respect to the sub-pixel region having no polarization member 130, it can be regarded that all polarization components in an azimuth of 0° to 180° are integrated for detection. Thus, the luminance value (Itotal) of the sub-pixel region having no polarization member 130 can be regarded as being equal to a value obtained by dividing an average intensity (Iave) of polarization components by a directional capability (η) of the polarization member 130. In this case, the following relationship is satisfied:

$IPL\text{-}max = Iave \cdot (1 + IPL)$ $IPL\text{-}min = Iave \cdot (1 - IPL).$ Since the directional capability (η) of the polarization member is a characteristic value that is independent from the azimuth of the polarization member, it can be presumed that the intensity ratio of Itotal to Iave becomes a constant. When the proportional constant is assumed to be 1, multiplying Itotal by (1+IPL) and (1−IPL) makes it possible to reproduce an image having IPL-max and IPL-min in each sub-pixel region. With respect to the sub-pixel regions 120 having the polarization members 130, an intensity that does not involve the polarization information can also be derived through interpolation of the intensities of the surrounding sub-pixel regions. Thus, the two-dimensional map of Itotal for typical image capture (i.e., for photography that does not use the polarization information) can be obtained in the same manner.

The process for restoring information of the sub-pixel region, located at the center, from the surrounding sub-pixel regions can be realized by a scheme and algorithm that are similar to those for color information demosaicing. Thus, an image containing the polarization information and a general image may be demosaiced and reconstructed based on an algorithm other than the above-described algorithm. The above-described positional relationship between each sub-pixel region and thus the white display sub-pixel regions W is illustrative and can be modified as appropriate. In addition, the polarization information of the sub-pixel regions having no polarization members is determined from the polarization information of four neighborhood white display sub-pixel regions W, as described above, and the positions of the four white display sub-pixel regions W are also illustrative and thus can be modified as appropriate.

Figure 10:
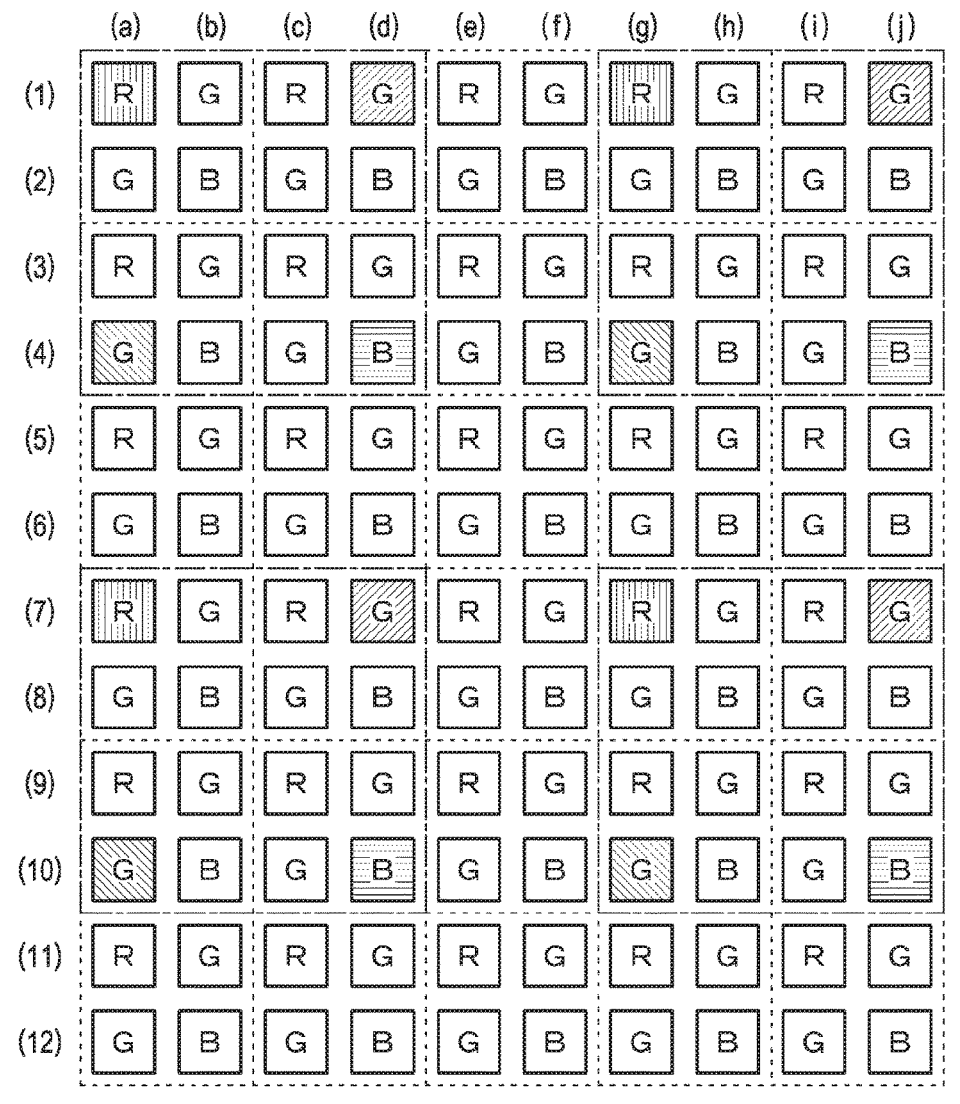

Instead of the sub-pixel-region plan layout shown in FIG. 5, an arrangement as in a sub-pixel-region plan layout shown in FIG. 10 may also be employed. The configuration in FIG. 10 has basically a Bayer color-filter arrangement and has a configuration in which red, green, blue, and green color filters are disposed in a pixel area constituted by four (2×2) sub-pixel regions and the polarization member is disposed in one of the four sub-pixel regions constituting each pixel area. In FIG. 10, a green display sub-pixel region G located at row b and column 3 is expressed by a green display sub-pixel region G(b, 3).

The light intensity Iq of light that is incident on the sub-pixel region having the polarization member, the sub-pixel region being included in the q-th pixel area (where q=1, 2, . . . , Q), is corrected based on the light intensities of light that is incident on the neighborhood sub-pixel regions that have no polarization members and that have the same detection wavelength band as the sub-pixel region having the polarization member.

Specifically, for example, with respect to the red display sub-pixel region R having the polarization member 130, the average value of the light intensities of the surrounding eight red display sub-pixel regions R having no polarization members 130 can be used as the light intensity of the red display sub-pixel region R when it is assumed to have no polarization member 130. For example, with respect to the red display sub-pixel region R(g, 7), the average value of the light intensities of the red display sub-pixel region R(g, 5), the red display sub-pixel region R(i, 5), the red display sub-pixel region R(i, 7), the red display sub-pixel region R(i, 9), the red display sub-pixel region R(g, 9), the red display sub-pixel region R(e, 9), the red display sub-pixel region R(e, 7), and the red display sub-pixel region R(e, 5) may be used as the light intensity of the red display sub-pixel region R(g, 7) when it is assumed to have no polarization member 130. On the basis of the determined average value of the light intensities and the light intensity of the red display sub-pixel region R(g, 7) having the polarization member 130, the polarization component intensity of the red display sub-pixel region R(g, 7) can also be obtained. With respect to the green display sub-pixel region G having the polarization member 130 and the blue display sub-pixel region B having the polarization member 130, the average value of the light intensities thereof can be obtained as in the manner described above. Thus, θPL-max, IPL-max, IPL-min, and IPL of one pixel-area group can be obtained from, for example, the red display sub-pixel region R(a, 1), the green display sub-pixel region G(c, 1), the blue display sub-pixel region B(c, 4), and the green display sub-pixel region G(a, 4). The same applies to the other pixel-area groups.

θPL-max, IPL-max, IPL-min, and IPL of the pixel area [e.g., the pixel area constituted by the red display sub-pixel region R(e, 1), the green display sub-pixel region G(f, 1), the blue display sub-pixel region B(f, 2), and the green display sub-pixel region G(e, 2)] disposed between the pixel-area groups can be determined as the average values of θPL-max, IPL-max, IPL-max, and IPL of two pixel-area groups disposed at two opposite ends of the pixel area or four pixel-area groups surrounding the pixel area.

Since the light intensity, the polarization component intensity, and the polarization direction of each sub-pixel region can be obtained as described above, for example, image data can be processed after photography on the basis of the polarization information. For example, performing desired processing on a portion of an image obtained by photography of the sky or window glass, a portion of an image obtained by photography of a water surface, or the like makes it possible to emphasize or attenuate polarization components or makes it possible to separate polarization components and non-polarization components. Thus, it is possible to improve the image contrast and to eliminate unwanted information. More specifically, for example, it is possible to perform such processing by specifying a photography mode during photography using a two-dimensional solid-state image capture device.

The two-dimensional solid-state image capture device in the first embodiment or each of the second to fourth embodiments described below can eliminate reflection in window glass. In addition, adding polarization information to image information also makes it possible to clarify the boundaries (contours) of multiple objects. It is also possible to detect the state of a road surface or an obstacle on a road surface. In addition, the two-dimensional solid-state image capture device can be applied to a variety of fields, including photography of a pattern incorporating birefringence of an object, measurement of retardation distribution, acquirement of an image under a polarized-light microscope, acquirement of a surface shape of an object, measurement of a surface texture of an object, detection of a moving object (such as a vehicle), and meteorological observation such as measurement of cloud distribution.

The two-dimensional solid-state image capture device in the first embodiment can basically be manufactured by the same method as a method for already available two-dimensional solid-state image capture devices, except for microfabrication of the polarization member 130. The microfabrication of the polarization member 130 can easily be realized using a technology for manufacturing semiconductor devices. Thus, the method for manufacturing the two-dimensional solid-state image capture device in the first embodiment is not described below. The same applies to the two-dimensional solid-state image capture devices in the third and fourth embodiments described below.

In the two-dimensional solid-state image capture device in the first embodiment, the wiring layer and the polarization member are made of the same material and are disposed on the same virtual plane. Accordingly, the wiring layer and the polarization member can be simultaneously formed in the same process by using a general semiconductor-device manufacturing process. Since the polarization member can be provided without an increase in the number of manufacturing processes, the manufacturing cost of the two-dimensional solid-state image capture device can be reduced. Moreover, since it is not necessary to add another layer for the polarization member, it is possible to achieve a lower-profile structure of the two-dimensional solid-state image capture device. The provision of the polarization member also does not involve an increase in the thickness of the two-dimensional solid-state image capture device. Since the thickness of the polarization member in the two-dimensional solid-state image capture device in the first embodiment or each of the third and fourth embodiments described below can be reduced to as small as about 0.1 μm, it is possible to achieve a lower-profile structure of the two-dimensional solid-state image capture device.

In addition, in the two-dimensional solid-state image capture device in the first embodiment or the second embodiment described below, the polarization member is disposed at the light incident side of one of multiple (M0) sub-pixel regions constituting each pixel area, and thus, Q polarization members (where Q≤Q0) are disposed in one pixel-area group constituted by Q0 pixel areas (where Q0≥3). That is, only Q polarization members are disposed in the total of Q0×M0 sub-pixel regions constituting one pixel-area group. Consequently, it is possible to minimize a sensitivity reduction due to the arrangement of the polarization members in the entire pixel area. Determination of the polarization component intensity and the polarization direction at the position of each pixel area by performing inter-pixel-area computation processing makes it possible to obtain polarization information with the spatial resolution being slightly compromised, while minimizing a reduction in the sensitivity. Furthermore, since only Q polarization members are disposed in the total of Q0×M0 sub-pixel regions constituting one pixel-area group, the computation processing for the amount and intensity of light received by the photoelectric conversion elements does not become complicated. In addition, information of the polarization component intensity, the polarization direction, and so on can be obtained in real time and information of the polarization direction and the polarization component intensity can also be obtained from a single image.

Second Embodiment

A second embodiment relates to a polarization-light data processing method for a two-dimensional solid-state image capture device according to a second mode of the present invention. The two-dimensional solid-state image capture device in the second embodiment may have the same configuration as the two-dimensional solid-state image capture device described above in the first embodiment, and thus, a detailed description is not given hereinafter.

The polarization-light data processing method for the two-dimensional solid-state image capture device in the second embodiment is a simplified one of the polarization-light data processing method for the two-dimensional solid-state image capture device in the first embodiment, thereby achieving a reduction in the amount of data processing. In the polarization-light data processing method for the two-dimensional solid-state image capture device in the second embodiment, Iq denotes the light intensity of light that is incident on the sub-pixel region having the polarization member and constituting the q-th pixel area (where q=1, 2, ..., Q). The maximum value Imax of the light intensities Iq is used as the maximum polarization intensity IPL-max of light that is incident on the pixel area, the angle θq of the pixel area where Imax is obtained is used as the polarization direction θPL-max in which the maximum polarization intensity IPL-max of light that is incident on the pixel area is obtained, and the minimum value Imin of the light intensities Iq is used as the minimum polarization intensity IPL-min of light that is incident on the pixel area.

For example, for Q=6 or Q=8, a polarization component intensity and a polarization direction can be obtained with an accuracy that does not cause a problem in practice and the amount of data processing can also be dramatically reduced compared to the first embodiment.

Third Embodiment

A third embodiment relates to the two-dimensional solid-state image capture device according to the second mode of the present invention. In the two-dimensional solid-state image capture device in the third embodiment, as shown in a schematic partial cross sectional view in FIG. 2A or 2B, a polarization member 230 is disposed at the light inside side of at least one of sub-pixel regions 220 constituting each pixel area. Each sub-pixel region has a light-shielding layer 23 for controlling (restricting) incidence of light on the photoelectric conversion element. The polarization member 230 and the light-shielding layer 23 are disposed on the same virtual plane. In this case, the polarization member 230 is a wire-grid polarization member and is made of, for example, aluminum (Al) or copper (Cu), and the light-shielding layer 23 is made of, for example, aluminum (Al) or tungsten (W).

Figure 2A:
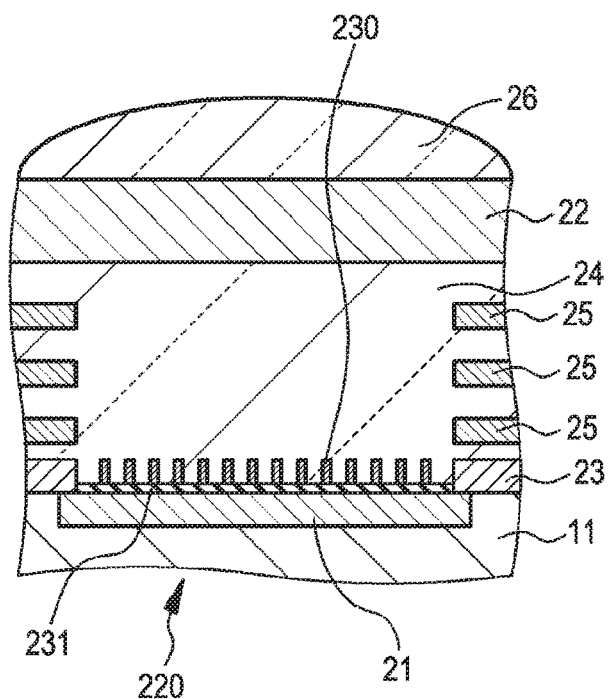
FIGS. 2A and 2B are partial cross-sectional views schematically showing a two-dimensional solid-state image capture device in a third embodiment.
Figure 2B:
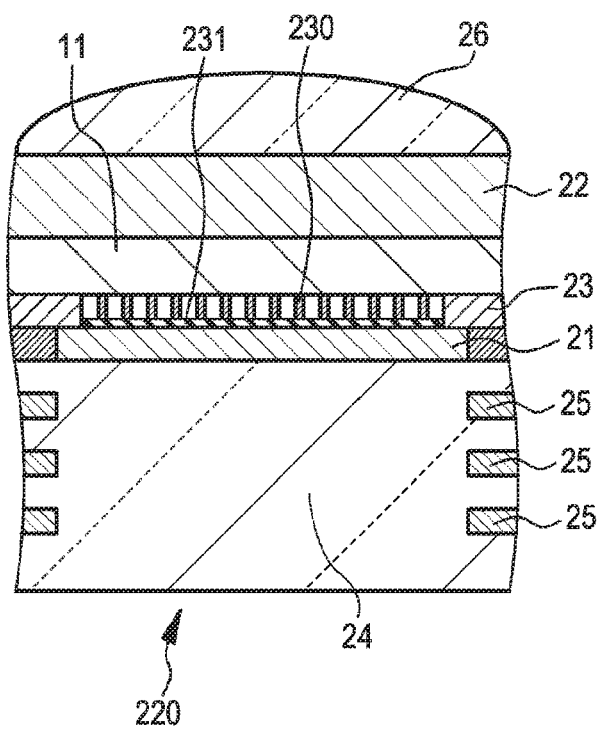

The two-dimensional solid-state image capture device shown in FIG. 2A is a frontside-illuminated two-dimensional solid-state image capture device, whereas the two-dimensional solid-state image capture device shown in FIG. 2B is a backside-illuminated two-dimensional solid-state image capture device. In the frontside-illuminated two-dimensional solid-state image capture device shown in FIG. 2A, light focused by a light-focusing element 26 is guided to the photoelectric conversion element 21 through a color filter 22, a smoothing layer 24, and the polarization member 230. The smoothing layer 24 is made of transparent material, such as SiO2 or SiN. The polarization member 230 is provided in an opening area of the light-shielding layer 23. The light is photoelectrically converted into electrical change, which is stored and is then read out as an electrical signal. On the other hand, in the backside-illuminated two-dimensional solid-state image capture device shown in FIG. 2B, light focused by a light-focusing element 26 is guided to the photoelectric conversion element 21 through a color filter 22, a substrate 11, and the polarization member 230, which is provided in an opening area of a light-shielding layer 23. The light is photoelectrically converted into electrical change, which is stored and is then read out as an electrical signal. There is also a case in which the color filter 22 is not disposed in the sub-pixel region 220 having the polarization member 230.

In the third embodiment, the polarization member 230 is provided above the photoelectric conversion element 21 with an insulating film 231 interposed therebetween. It is preferable that the thickness of the insulating film 231 be 1×10-7 m or less and be as small as possible. When an electromagnetic wave in the range of a visual-light wavelength to a near-infrared-light wavelength is incident on the polarization member 230 and the periodic structure of the strip-shaped conductive light-shielding material layers of the polarization member 230 and the wavelength of the incident electromagnetic wave satisfy a resonance condition, the electromagnetic wave couples with polarized charge or electrons in the material contained in the strip-shaped conductive light-shielding material layers to generate surface plasmon polaritons. In this state, near-field light is produced in an area defined by a closed electric line of force of polarized charge (i.e., an area of non-propagating light). The near-field light can exist in only a range comparable to the electromagnetic wavelength and the intensity of the near-field light becomes weak exponentially. Thus, the near-field light can be received (measured) by only the photoelectric conversion element 21 with the ultrathin (100 nm or less) insulating film 231 interposed between the photoelectric conversion element 21 and the light-shielding layer 23. Accordingly, when a structure in which the polarization member 230 and the photoelectric conversion element 21 are disposed with the insulating film 231 interposed therebetween is employed, a smaller thickness of the insulating film 231 is more preferable.

Thus, in the two-dimensional solid-state image capture device in the third embodiment, surface plasmon polaritons excited on the surface of the polarization member 230 by incident electromagnetic waves propagate and pass through the strip-shaped conductive light-shielding material layers 31, and the propagation light is re-radiated. The photoelectric conversion element 21 can receive the re-radiated propagation light or can detect an abrupt electric-field change caused by polarization or the like of the material for the conductive light-shielding material layers 31.

In the two-dimensional solid-state image capture device in the third embodiment, the light shielding layer and the polarization member are disposed on the same virtual plane. Accordingly, the light-shielding layer and the polarization member can be simultaneously formed in the same process by using a general semiconductor-device manufacturing process. Since the polarization member can be provided without an increase in the number of manufacturing processes, the manufacturing cost of the two-dimensional solid-state image capture device can be reduced. Moreover, since it is not necessary to add another layer for the polarization member, it is possible to achieve a lower-profile structure of the two-dimensional solid-state image capture device. The provision of the polarization member also does not involve an increase in the thickness of the two-dimensional solid-state image capture device.

The two-dimensional solid-state image capture device according to the fourth mode of the present invention described in the first embodiment can also be applied to the two-dimensional solid-state image capture device described in the third embodiment, and also the polarization-light data processing method for the two-dimensional solid-state image capture device according to the first or second mode of the present invention described in the first or second embodiment can be applied to such a form.

Fourth Embodiment

A fourth embodiment relates to the two-dimensional solid-state image capture device according to the third mode of the present invention. In the two-dimensional solid-state image capture device in the fourth embodiment, as shown in a schematic partial cross sectional view in FIG. 3A or 3B, a wire-grid polarization member 330 is disposed at the light inside side of one of sub-pixel regions 320 constituting each pixel area and color filters (not show) are disposed at the light incident sides of the remaining sub-pixel regions. The color filters and the polarization member 330 are disposed on the same virtual plane.

Figure 3A:
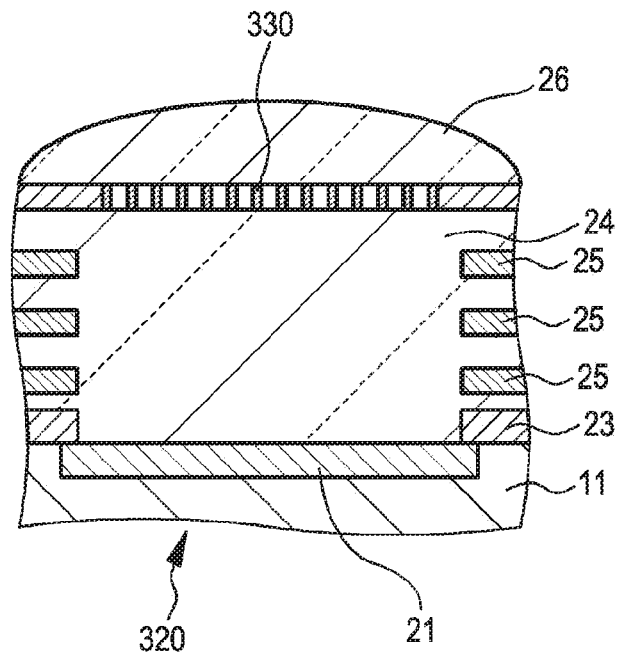
FIGS. 3A and 3B are partial cross-sectional views schematically showing a two-dimensional solid-state image capture device in a fourth embodiment.
Figure 3B:
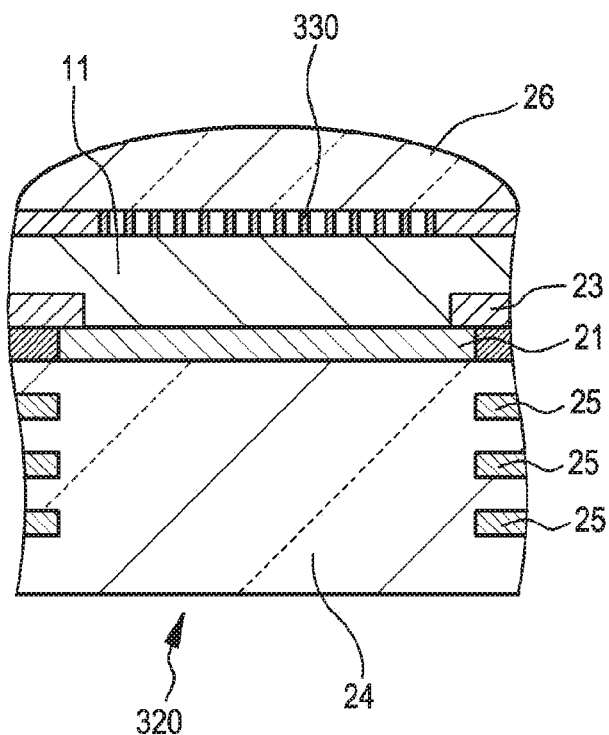

The two-dimensional solid-state image capture device shown in FIG. 3A is a frontside-illuminated two-dimensional solid-state image capture device, whereas the two-dimensional solid-state image capture device shown in FIG. 3B is a backside-illuminated two-dimensional solid-state image capture device. In the frontside-illuminated two-dimensional solid-state image capture device shown in FIG. 3A, light focused by a light-focusing element 26 is guided to the photoelectric conversion element 21 through a polarization member 330, a smoothing layer 24, and an opening area of a light-shielding layer 23. The light-focusing element 26 has an on-chip convex microlens and the smoothing layer 24 is made of transparent material, such as SiO2 or SiN. The light is photoelectrically converted into electrical change, which is stored and is then read out as an electrical signal. On the other hand, in the backside-illuminated two-dimensional solid-state image capture device shown in FIG. 3B, light focused by a light-focusing element 26 is guided to the photoelectric conversion element 21 through a polarization member 330, a substrate 11, and an opening area of a light-shielding layer 23. The light is photoelectrically converted into electrical change, which is stored and is then read out as an electrical signal.

Since the color filter and the polarization member in the two-dimensional solid-state image capture device in the fourth embodiment are disposed on the same virtual plane, it is unlikely the height of one sub-pixel region having the polarization member and the height of another sub-pixel region having the color filter differ from each other. Moreover, since it is not necessary to add another layer for the polarization member, it is possible to achieve a lower-profile structure of the two-dimensional solid-state image capture device. The provision of the polarization member also does not involve an increase in the thickness of the two-dimensional solid-state image capture device.

The two-dimensional solid-state image capture device according to the fourth mode of the present invention described in the first embodiment can also be applied to the two-dimensional solid-state image capture device described in the fourth embodiment, and also the polarization-light data processing method for the two-dimensional solid-state image capture device according to the first or second mode of the present invention described in the first or second embodiment can be applied to such a form.

Although preferred embodiments of the present invention have been described above, the present invention is not limited to the embodiments. In the embodiments described above, the polarization member is exclusively used to obtain the polarization information of the solid-state image capture element that is sensitive to a visible light wavelength band. However, when the photoelectric conversion element (the light-receiving element) is sensitive to infrared or ultraviolet light, increasing or reducing the formation pitch P0 of the strip-shaped conductive light-shielding material layers so as to correspond to the sensitivity allows the polarization member to function in an arbitrary wavelength band.

The plan layout of the sub-pixel regions in the two-dimensional solid-state image capture devices according to the first to third modes of the present invention described in the first, third, and fourth embodiments are not limited to those described with reference to FIGS. 5 and 10. For example, the plan layout of the sub-pixel regions may be a plan layout illustrated in FIG. 11 or 12. For a CMOS solid-state image capture device having the plan layout shown in FIG. 11, it is possible to employ a 2×2 pixel sharing scheme in which 2×2 sub-pixel regions share a selecting transistor, a reset transistor, and an amplifying transfer. In an image capture mode in which no pixel summation is performed, image capture involving the polarization information is performed, and in a mode in which charges stored in 2×2 sub-pixel regions are subjected to summation using floating diffusions, a general captured image into which all polarization components are integrated can be provided. In the plan layout shown in FIG. 12, the polarization members in one direction are arranged in 2×2 sub-pixel regions. Thus, inter-pixel discontinuity in the conductor lattice is less likely to occur, thereby making it possible to achieve high-quality polarization image capture.

Forming two types of transparent substrate on a transparent substrate or a base by using the polarization members described in the embodiments and allocating the transparent substrates, in an image display apparatus such as a television receiver, to corresponding pixels for the right eye and the left eye makes it possible to provide an image for stereoscopic vision. In addition, for example, embedding multiple images in a single image enables multiple people to view different images (programs) at the same time. In addition, fabricating, in two layers in the recording medium in a DVD or Blu-ray optical-disk system, a pit-and-bump structure for vertical polarization and a pit-and-bump structure for horizontal polarization and using a laser polarized vertically and horizontally allows twice the amount of information to be recorded with the same size. The present invention can also be applied to optical communications equipment and so on.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device, comprising:
   a plurality of pixel areas in a two-dimensional matrix, each pixel area of the plurality of pixel areas comprises a plurality of sub-pixel regions, each sub-pixel region of the plurality of sub-pixel regions comprises a photoelectric conversion element and a light-shielding layer;
   a polarization member on a light incident side of each of a plurality of first sub-pixel regions of the plurality of sub-pixel regions; and
   a color filter on the light incident side of each of a plurality of second sub-pixel regions of the plurality of sub-pixel regions, wherein
   the polarization member is excluded in the plurality of second sub-pixel regions,
   the color filter is different from the polarization member,
   the polarization member comprises a plurality of strip-shaped conductive light-shielding material layers,
   the polarization member and the light-shielding layer are on a common plane, and
   a pixel area group of the plurality of pixel areas comprises a plurality of $Q_0$ pixel areas (where $Q_0 \geq 3$), the pixel area group satisfies:

$$\theta_q = \theta_1 + (180/Q) \times (q-1)(\text{degree}),$$

wherein
   Q indicates a positive integer (where $3 \leq Q \leq Q_0$),
   $\theta_1$ indicates an angle defined by a first direction and a direction in which the plurality of strip-shaped conductive light-shielding material layers extend in the polarization member in a third sub-pixel region, of the plurality of sub-pixel regions, included in a q-th pixel area (where q=1), $\theta_q$ indicates an angle defined by a second direction and the direction in which the plurality of strip-shaped conductive light-shielding material layers extend in the polarization member in a fourth sub-pixel region, of the plurality of sub-pixels regions, included in a q-th pixel area (where $2 \leq q \leq Q$) selected from Q−1 pixel areas, and the Q−1 pixel areas are selected from the plurality of pixel areas other than the q-th pixel area (where q=1).

2. The imaging device according to claim 1, wherein each sub-pixel region of the plurality of sub-pixel regions further has a wiring layer.

3. The imaging device according to claim 2, wherein
the polarization member and the wiring layer are of a same material, and
the polarization member and the wiring layer are on the common plane.

4. The imaging device according to claim 1, wherein
the polarization member has slit areas between the plurality of strip-shaped conductive light-shielding material layers.

5. The imaging device according to claim 1, wherein the color filter and the polarization member are on the common plane.

6. The imaging device according to claim 1, wherein Q is 4.

7. The imaging device according to claim 1, wherein
the polarization member is configured to transmit light,
the transmitted light has a polarization component in a third direction perpendicular to the direction, in which the plurality of strip-shaped conductive light-shielding material layers extend.

8. The imaging device according to claim 1, wherein
the polarization member is configured to block light that has a polarization component in a fourth direction parallel to the direction, in which the plurality of strip-shaped conductive light-shielding material layers extend.

9. The imaging device according to claim 3, wherein the same material is one of aluminium (Al) or copper (Cu).

* * * * *